United States Patent
Kang et al.

(10) Patent No.: US 11,424,314 B2
(45) Date of Patent: Aug. 23, 2022

(54) DISPLAY DEVICE

(71) Applicant: Samsung Display Co., LTD., Yongin-si (KR)

(72) Inventors: Ki Nyeng Kang, Sejong-Si (KR); Hyun Kim, Seoul (KR); Seungmin Song, Gwangju (KR); Minseong Yi, Seoul (KR); Sanghoon Lee, Hwaseong-si (KR); Seonbeom Ji, Seoul (KR); Jung Eun Hong, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 142 days.

(21) Appl. No.: 17/036,838

(22) Filed: Sep. 29, 2020

(65) Prior Publication Data

US 2021/0217841 A1    Jul. 15, 2021

(30) Foreign Application Priority Data

Jan. 14, 2020 (KR) .................. 10-2020-0005023

(51) Int. Cl.
*H01L 27/32* (2006.01)
*H01L 51/52* (2006.01)

(52) U.S. Cl.
CPC ........ *H01L 27/3276* (2013.01); *H01L 27/323* (2013.01); *H01L 51/5253* (2013.01)

(58) Field of Classification Search
CPC ............... H01L 27/3276; H01L 27/323; H01L 51/5253; H01L 27/3248; H01L 2251/5338; H01L 51/5256; H01L 27/3223; H01L 27/3246; H01L 27/3225; H01L 27/3258; H01L 27/3262; H01L 27/3279; H01L 51/5246; H01L 2251/301; G06F 3/0412; G06F 3/04164; G06F 3/0446; G06F 3/041
See application file for complete search history.

(56) References Cited

U.S. PATENT DOCUMENTS

| | | | |
|---|---|---|---|
| 10,139,969 B2 | 11/2018 | Kang et al. | |
| 2018/0026088 A1* | 1/2018 | Oh ................... | H05K 1/111 361/749 |
| 2018/0329552 A1 | 11/2018 | Song et al. | |

FOREIGN PATENT DOCUMENTS

| KR | 10-2018-0078571 A | 7/2018 |
|---|---|---|
| KR | 10-2018-0124326 A | 11/2018 |

* cited by examiner

*Primary Examiner* — Kyoung Lee
(74) *Attorney, Agent, or Firm* — Lewis Roca Rothgerber Christie LLP

(57) ABSTRACT

A display device includes a base layer including an active area and a peripheral area outside the active area, a circuit element layer including a pixel in the active area of the base layer, a light emitting element layer including light emitting elements on the circuit element layer, a thin film encapsulation layer covering the light emitting element layer and including an organic layer, and an input detection layer on the thin film encapsulation layer and including a detection electrode and a detection wire connected to the detection electrode. The circuit element layer includes a connection wire overlapping the detection wire in the peripheral area, and a contact part to connect the detection wire and the connection wire in the peripheral area. The contact part is spaced apart from the organic layer of the thin film encapsulation layer on a plane.

20 Claims, 11 Drawing Sheets

DISPLAY DEVICE

CROSS-REFERENCE TO RELATED APPLICATION

This application claims priority to and the benefit of Korean Patent Application No. 10-2020-0005023, filed on Jan. 14, 2020, the entire content of which is hereby incorporated by reference.

BACKGROUND

1. Field

The present disclosure herein relates to a display device, and more particularly, to a display device capable of detecting an external input.

2. Description of the Related Art

An electronic device is activated in response to an electrical signal. An electronic device may include devices composed of various suitable electronic components, such as a display panel for displaying an image, or an input detection unit for detecting an external input. The electronic components can be electrically interconnected by variously and suitably arranged signal lines.

The signal lines may be provided in various suitable numbers depending on the number of electronic components or the processing environment, and the signal lines are designed to be arranged in a proper space for preventing or reducing electrical signal interference within a predetermined or set panel area. The signal lines may receive electrical signals applied from the outside through various suitable pads. As signal processing speed or processing data of a display device increases, a large number of signal lines and pads are required. In addition, some of the signal lines must be disposed in a bezel area of the display device. Recently, various efforts have been made to minimize or reduce the bezel area of a display device.

SUMMARY

Aspects of example embodiments of the present disclosure provides a display device that can minimize or reduce the bezel area.

An example embodiment of the present disclosure provides a display device including: a base layer including an active area and a peripheral area outside the active area; a circuit element layer including a pixel in the active area of the base layer; a light emitting element layer including light emitting elements on the circuit element layer; a thin film encapsulation layer covering the light emitting element layer and including an organic layer; and an input detection layer on the thin film encapsulation layer and including a detection electrode and a detection wire connected to the detection electrode, wherein the circuit element layer includes: a connection wire overlapping the detection wire in the peripheral area; and a contact part connecting the detection wire and the connection wire in the peripheral area, wherein the contact part is spaced apart from the organic layer of the thin film encapsulation layer on a plane.

In an embodiment, the thin film encapsulation layer may further include: a first inorganic layer between the light emitting element layer and the organic layer; and a second inorganic layer covering the organic layer.

In an embodiment, at least a portion of the contact part may be in a contact hole defined through the second inorganic layer, wherein the detection wire may be connected to the connection wire through the contact hole.

In an embodiment, the display device may further include a dam part on the circuit element layer and surrounding the active area, wherein the second inorganic layer may cover the dam part.

In an embodiment, the contact part may be outside the dam part.

In an embodiment, the detection electrode may include: a first detection electrode; and a second detection electrode electrically insulated from the first detection electrode to form a capacitance.

In an embodiment, the detection wire may be connected to the first detection electrode.

In an embodiment, the first detection electrode may include first detection patterns and a first connection pattern electrically connecting the first detection patterns, wherein the second detection electrode may include second detection patterns and a second connection pattern electrically connecting the second detection patterns.

In an embodiment, the input detection layer may include: a first conductive layer on the thin film encapsulation layer; a first input insulating layer on the first conductive layer; and a second conductive layer on the first input insulating layer, wherein the detection wire is on the second conductive layer, and the first conductive layer and the second conductive layer are in contact with each other.

In an embodiment, the circuit element layer may further include a driving signal wire in the peripheral area of the base layer to supply a driving signal to the pixel, wherein the circuit element layer may include a plurality of connection wires and the plurality of connection wires may be spaced apart from each other on the same layer as the driving signal wire.

In an embodiment, the circuit element layer may further include a driving signal wire in the peripheral area of the base layer to supply a driving signal to the pixel, wherein the connection wire may overlap the driving signal wire in a different layer on a plane.

In an example embodiment of the present disclosure, a display device includes: a base layer including an active area and a peripheral area outside the active area; a circuit element layer including a pixel in the active area of the base layer; a light emitting element layer including light emitting elements on the circuit element layer; a thin film encapsulation layer covering the light emitting element layer and including an organic layer; and an input detection layer on the thin film encapsulation layer, and including a detection electrode and a detection wire connected to the detection electrode, wherein the circuit element layer includes: a driving signal wire in the peripheral area of the base layer to supply a driving signal to the pixel; a connection wire overlapping the driving signal wire in the peripheral area; and a contact part connecting the detection wire and the connection wire in the peripheral area, wherein the contact part is spaced apart from the organic layer of the thin film encapsulation layer on a plane.

In an embodiment, the thin film encapsulation layer may include: a first inorganic layer between the light emitting element layer and the organic layer; and a second inorganic layer covering the organic layer.

In an embodiment, at least a portion of the contact part may be in a contact hole defined through the second inorganic layer, wherein the detection wire may be connected to the connection wire through the contact hole.

In an embodiment, the display device may further include a dam part on the circuit element layer and surrounding the active area, wherein the second inorganic layer may cover the dam part.

In an embodiment, the contact part may be outside the dam part.

In an embodiment, the detection electrode may include: a first detection electrode; and a second detection electrode electrically insulated from the first detection electrode to form a capacitance.

In an embodiment, the detection wire may be electrically connected to the first detection electrode.

In an embodiment, the first detection electrode may include first detection patterns and a first connection pattern electrically connecting the first detection patterns, wherein the second detection electrode may include second detection patterns and a second connection pattern electrically connecting the second detection patterns.

In an embodiment, the input detection layer may include: a first conductive layer on the thin film encapsulation layer; a first input insulating layer on the first conductive layer; and a second conductive layer on the first input insulating layer, wherein the detection wire may be on the second conductive layer, and the first conductive layer and the second conductive layer may be in contact with each other.

BRIEF DESCRIPTION OF THE DRAWINGS

The accompanying drawings are included to provide a further understanding of the present disclosure, and are incorporated in and constitute a part of this specification. The drawings illustrate example embodiments of the present disclosure and, together with the description, serve to explain principles of the present disclosure. In the drawings.

DETAILED DESCRIPTION

Figure 1:
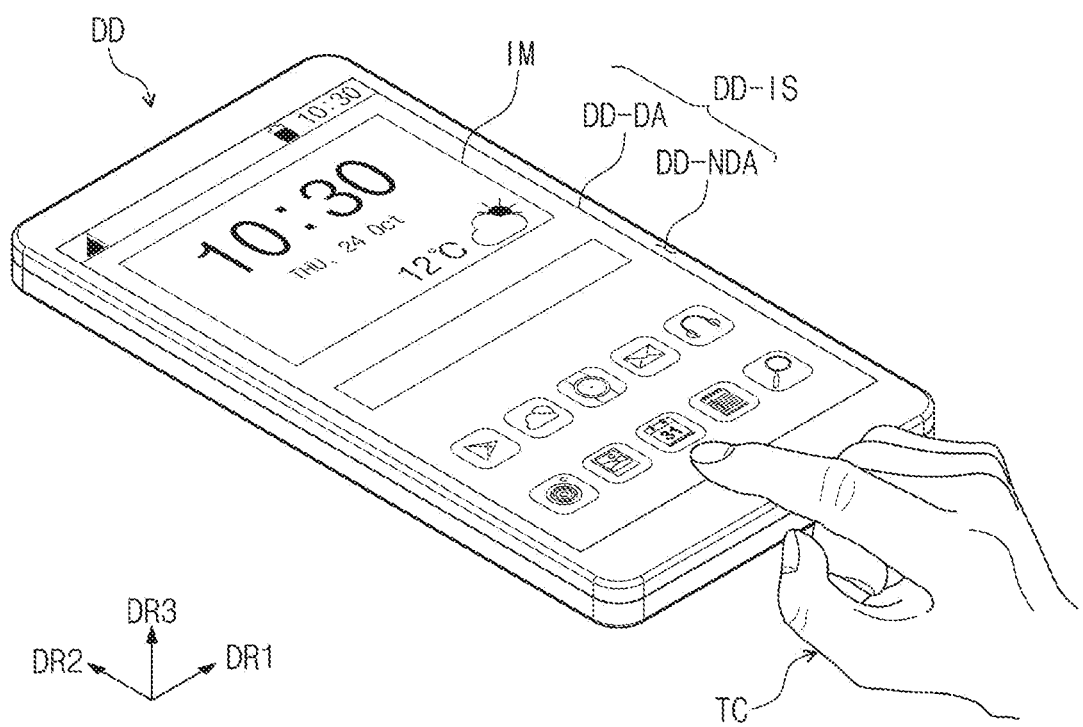
FIG. 1 is a perspective view of a display device according to an embodiment of the present disclosure.

In this specification, when a component (or, an area, a layer, a part, etc.) is referred to as being "on", "connected to" or "combined with" another component, the component may be directly on, connected to, or combined with the other component, or one or more additional components may present be therebetween.

Like reference numerals refer to like elements. Additionally, in the drawings, the thicknesses, proportions, and dimensions of components may be exaggerated for effective description. As used herein, the term "substantially," "about," "approximately," and similar terms are used as terms of approximation and not as terms of degree, and are intended to account for the inherent deviations in measured or calculated values that would be recognized by those of ordinary skill in the art. As used herein, the term "and/or" includes any and all combinations of one or more of the associated listed items.

It will be understood that the terms "first" and "second" are used herein to describe various components, but these components should not be limited by these terms. The above terms are used only to distinguish one component from another. For example, a first component may be referred to as a second component and vice versa without departing from the scope of the present disclosure. The terms of a singular form may include plural forms unless otherwise specified or unless the context clearly indicates otherwise.

In addition, terms such as "below", "the lower side", "on", and "the upper side" are used to describe a relationship of configurations (e.g., a spatial relationship between components) shown in the drawing. The terms describe a relative concept based on a direction shown in the drawing.

In various embodiments of the present disclosure, the terms "include," "comprise," "including," or "comprising," specifies a property, a region, a fixed number, a step, a process, an element and/or a component but do not exclude other properties, regions, fixed numbers, steps, processes, elements and/or components. As used herein, the use of the term "may," when describing embodiments of the present disclosure, refers to "one or more embodiments of the present disclosure."

Unless otherwise defined, all terms (including technical and scientific terms) used herein have the same meaning as commonly understood by those of ordinary skill in the art to which this present disclosure belongs. In general, terms defined in commonly used dictionaries should be interpreted as having a meaning that is consistent with their meaning in the context of the relevant art and/or the present specification, and should not be interpreted in an abnormal, idealized, or overly formal sense, unless expressly so defined herein.

Hereinafter, an embodiment of the present disclosure will be described with reference to the drawings.

Figure 2:
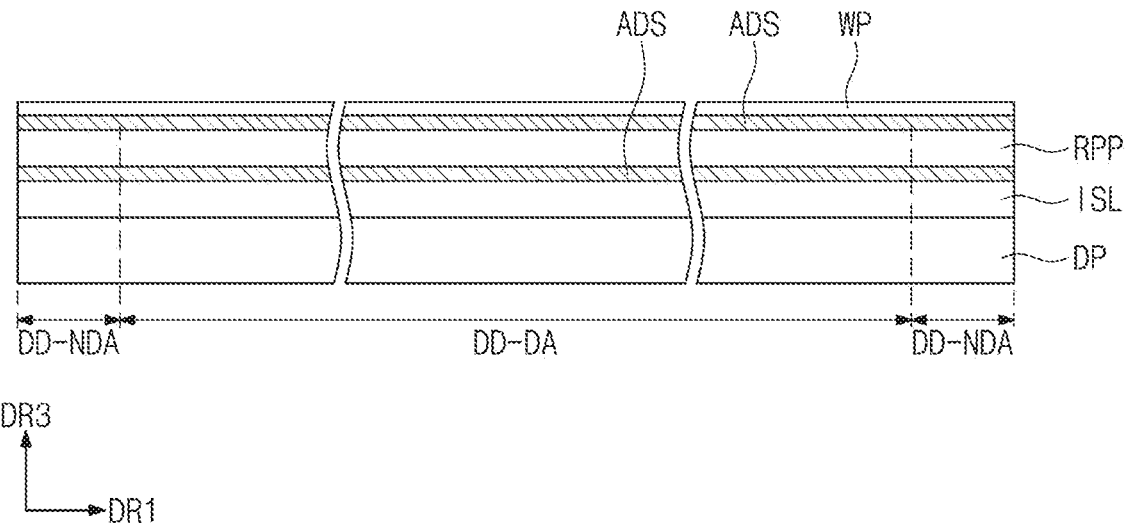
FIG. 2 is a cross-sectional view of a display device according to an embodiment of the present disclosure.

FIG. 1 is a perspective view of a display device DD according to an embodiment of the present disclosure. FIG. 2 is a cross-sectional view of a display device DD according to an embodiment of the present disclosure.

As shown in FIG. 1, a display device DD may display an image IM through a display surface DD-IS. The display surface DD-IS is parallel to the plane defined by the first direction axis DR1 and the second direction axis DR2. The normal direction of the display surface DD-IS, for example, a thickness direction of the display device DD, is indicated by a third direction axis DR3.

The front surface (or the upper surface) and the back surface (or lower surface) of each of the components or the members described below are distinguished by the third direction axis DR3. However, the first to third direction axes DR1, DR2, DR3 shown in this embodiment are merely illustrative. Hereinafter, the first to third directions are defined as the directions indicated by the first to third direction axes DR1, DR2, and DR3, respectively, and refer to the same reference numerals.

In an embodiment of the present disclosure, the display device DD having a planar display surface is shown, but the present disclosure is not limited thereto. The display device DD may have a curved display surface. The display device DD may have a stereoscopic display surface. The stereoscopic display surface has a plurality of display areas indicating different directions, and may have, for example, a polygonal columnar display surface.

The display device DD according to this embodiment may be a rigid display device. However, the present disclosure is not limited thereto, and the display device DD according to the present disclosure may be a flexible display device. The flexible display device may be a foldable type (e.g., foldable kind of) display device and/or a bending type (e.g., bendable kind of) display device with a partial area bent or bendable (e.g., configured to bend).

In this embodiment, FIG. 1 illustrates an example of a display device DD applicable to (e.g., compatible with) a portable terminal. Electronic modules, camera modules, and power modules mounted on a main board may be disposed in a bracket/case together with the display device DD to constitute a portable terminal. The display device DD according to the present disclosure may be applied to small and medium-sized electronic devices such as tablets, car navigations, game consoles, and smart watches in addition to large-sized electronic devices such as televisions and monitors.

As shown in FIG. 1, the display surface DD-IS includes an image area DD-DA on which an image IM is displayed and a bezel area DD-NDA adjacent to the image area DD-DA. The bezel area DD-NDA is an area where no image is displayed. FIG. 1 shows icon images as an example of an image IM.

As shown in FIG. 1, the image area DD-DA may be substantially rectangular. The term "substantially rectangular" includes not only a rectangular shape in a mathematical sense, but also includes a rectangular shape in which no vertex is defined in the vertex area (or corner area) but the boundary of a curve is defined. For example, "substantially rectangular" includes a generally rectangular shape having a curved corner.

The bezel area DD-NDA may partially or entirely surround the image area DD-DA. However, the present disclosure is not limited thereto, and the image area DD-DA and the bezel area DD-NDA may be designed in different shapes. The bezel area DD-NDA may be disposed only on one side of the image area DD-DA. Depending on a combination shape of the display device DD and other components of the electronic device, the bezel area DD-NDA may not be exposed to the outside. For example, in some embodiments, the bezel area DD-NDA may be between the display area DD-DA and one or more other components of the electronic device.

The display device DD according to an embodiment of the present disclosure can detect a user input TC applied from the outside. The user input TC may be any one or combination of various suitable external inputs, for example, a part of a user's body and/or an instrument such as a stylus pen. The display device DD may detect the user input TC by detecting a change in one or a combination of reflected light, temperature, pressure, ultrasonic waves, and/or electromagnetic waves caused by the user or by the user input TC. In the present embodiment, it is assumed and described that the user input TC is a touch input by the user's hand applied to the front surface of the display device DD but this is an example, and as described above, the user input TC may be provided in various suitable forms. The display device DD may detect the user input TC applied to a side surface or a rear surface of the display device DD according to the structure of the display device DD, but the present disclosure is not limited thereto.

FIG. 2 illustrates a cross section of the display device DD defined by the first direction axis DR1 and the third direction axis DR3. In FIG. 2, the components of the display device DD are simply shown to explain their stacking relationship.

The display device DD according to an embodiment of the present disclosure may include a display panel DP, an input detection layer ISL, an anti-reflector RPP, and a window WP. The components of at least some of the display panel DP, the input detection layer ISL, the anti-reflector RPP, and the window WP may be formed by a continuous process, or at least some of the components may be combined with each other through an adhesive member. The adhesive members ADS may be a transparent adhesive member such as a Pressure Sensitive Adhesive (PSA) film, an Optically Clear Adhesive (OCA) film, or an Optically Clear Resin (OCR). The adhesive member described in more detail below may include conventional adhesives or gluing agents. In an embodiment of the present disclosure, the anti-reflector RPP and the window WP may be replaced with other components or may be omitted.

In FIG. 2, the input detection layer ISL formed through a continuous process among (e.g., a continuous process for forming) the input detection layer ISL, the anti-reflector RPP, and the window WP is directly disposed on the display panel DP. In this specification, "component B is disposed directly on component A" means that no separate adhesive layer/adhesive member is disposed between component A and component B. Component B is formed through a continuous process on the base surface provided by component A after component A is formed.

In this embodiment, the anti-reflector RPP and the window WP are a "panel" type (e.g., kind), and the input detection layer ISL is a "layer" type (e.g., kind). The "panel" type (e.g., components of the "panel" type) includes a base layer that provides a base side, such as a resin film, a composite film, a glass substrate, etc. but in the "layer" type (e.g., components of the "layer" type), the base layer may be omitted. For example, components of the "layer" type are disposed on the base surface provided by the other components. In an embodiment of the present disclosure, the anti-reflector RPP and the window WP may be the "layer" type.

The display panel DP generates an image, and the input detection unit ISL obtains coordinate information of an external input (e.g., a touch event). The display device DD according to an embodiment of the present disclosure may further include a protection member disposed on the lower surface of the display panel DP. The protection member may be coupled to the display panel DP through an adhesive member.

The display panel DP according to an embodiment of the present disclosure may be a light emitting display panel, but is not limited thereto. For example, the display panel DP may be an organic light emitting display panel or a quantum dot light emitting display panel. The panels are distinguished according to the composition of the light emitting element. A light emitting layer of the organic light emitting display panel may include (e.g., be) an organic light emitting material. A light emitting layer of the quantum dot light emitting display panel may include (e.g., be) quantum dot, quantum rod, and/or the like. Hereinafter, the display panel DP is described as an organic light emitting display panel.

The anti-reflector RPP reduces the reflectance of external light incident from the upper side of the window WP. The anti-reflector RPP according to an embodiment of the present disclosure may include a retarder and a polarizer. The retarder may be a film type (e.g., film-based retarder) or a liquid crystal coating type (e.g., liquid crystal-based retarder), and the retarder may include a λ/2 (half-wavelength) retarder and/or a λ/4 (quarter-wavelength) retarder. The polarizer may also be of film type (e.g., film-based polarizer) or liquid crystal coating type (e.g., liquid crystal-based polarizer). The film type includes a stretch-type (e.g., stretch-based or stretchable) synthetic resin film, and the liquid crystal coating type may include liquid crystals arranged in a predetermined or set arrangement. The retarder and the polarizer may further include a protective film. Each of the retarder and the polarizer, itself or the protective film, may be defined as the base layer of the anti-reflector RPP.

The anti-reflector RPP according to an embodiment of the present disclosure may include color filters. The color filters have a predetermined or set arrangement. The arrangement of the color filters may be determined in consideration of (e.g., may depend on) the light emission colors of the pixels included in the display panel DP. The anti-reflector RPP may further include a black matrix adjacent to the color filters. For example, in some embodiments, the black matrix may be between the color filters to separate the color filters.

The anti-reflector RPP according to an embodiment of the present disclosure may include an offset interference structure. For example, the offset interference structure may include a first reflective layer and a second reflective layer that are disposed on different layers (levels). The first reflected light and the second reflected light, which are respectively reflected by the first reflective layer and the second reflective layer, may cancel each other (e.g., may destructively interfere with each other), thereby reducing the external light reflectance.

The window WP according to an embodiment of the present disclosure may include a glass substrate and/or a synthetic resin film. The window WP is not limited to a single layer. The window WP may include two or more films bonded by an adhesive member. The window WP may further include a functional coating layer. The functional coating layer may include an anti-fingerprint layer, an anti-reflective layer, and/or a hard coating layer.

Figure 3:
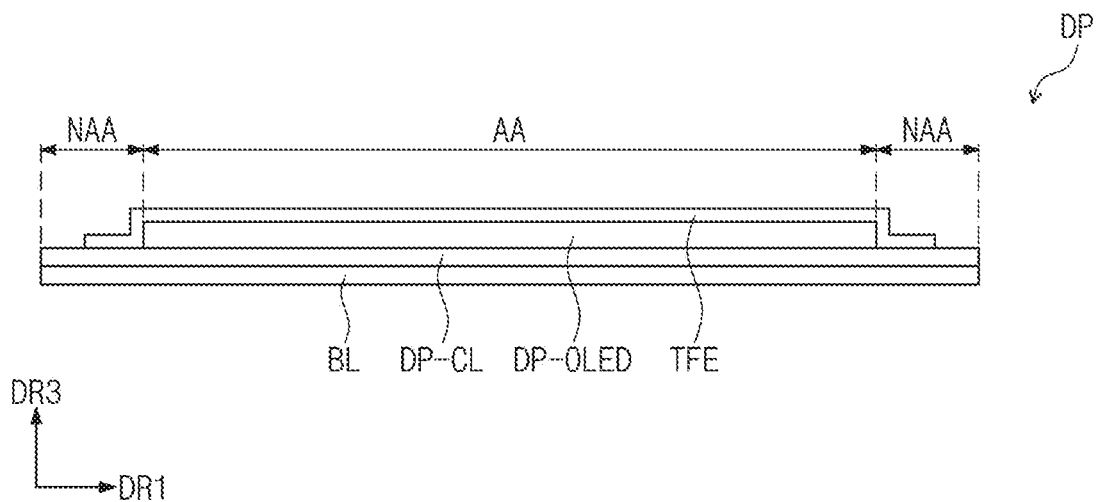
FIG. 3 is a cross-sectional view of a display panel shown in FIG. 2.

FIG. 3 is a cross-sectional view of the display panel DP shown in FIG. 2.

As shown in FIG. 3, the display panel DP includes a base layer BL, a circuit element layer DP-CL disposed on the base layer BL, a light emitting element layer DP-OLED, and a thin film encapsulation layer TFE. An active area AA and a peripheral area NAA corresponding to the image area DD-DA and the bezel area DD-NDA shown in FIG. 1 may be defined in the display panel DP. In this specification, "one area/portion corresponding to another area/portion" means "the one area/portion overlaps the other area/portion", but is not limited to having the same area and/or the same shape. For example, the one area/portion may have a different area and/or shape than the other area/portion.

The base layer BL may include at least one synthetic resin film. The base layer BL may include a glass substrate, a metal substrate, and/or an organic/inorganic composite substrate.

The circuit element layer DP-CL is disposed on the base layer BL. The circuit element layer DP-CL includes circuit elements and at least one insulating layer. The insulating layer(s) may include at least one inorganic layer and at least one organic layer. Circuit elements may include signal lines, pixel driving circuits, and/or the like.

The light emitting element layer DP-OLED is disposed on the circuit element layer DP-CL. The light emitting element layer DP-OLED includes organic light emitting diodes as a light emitting element. The light emitting element layer DP-OLED may further include an organic layer such as a pixel defining layer.

The thin film encapsulation layer TFE may be disposed on the light emitting element layer DP-OLED to seal the light emitting element layer DP-OLED. The thin film encapsulation layer TFE can (e.g., may) cover the entire active area AA. The thin film encapsulation layer TFE may cover some areas of the peripheral area NAA.

The thin film encapsulation layer TFE includes a plurality of thin films. Some thin films are disposed to improve optical efficiency, and some thin films are disposed to protect the organic light emitting diodes. A more detailed description of the thin film encapsulation layer TFE will be described in more detail later.

Figure 4:
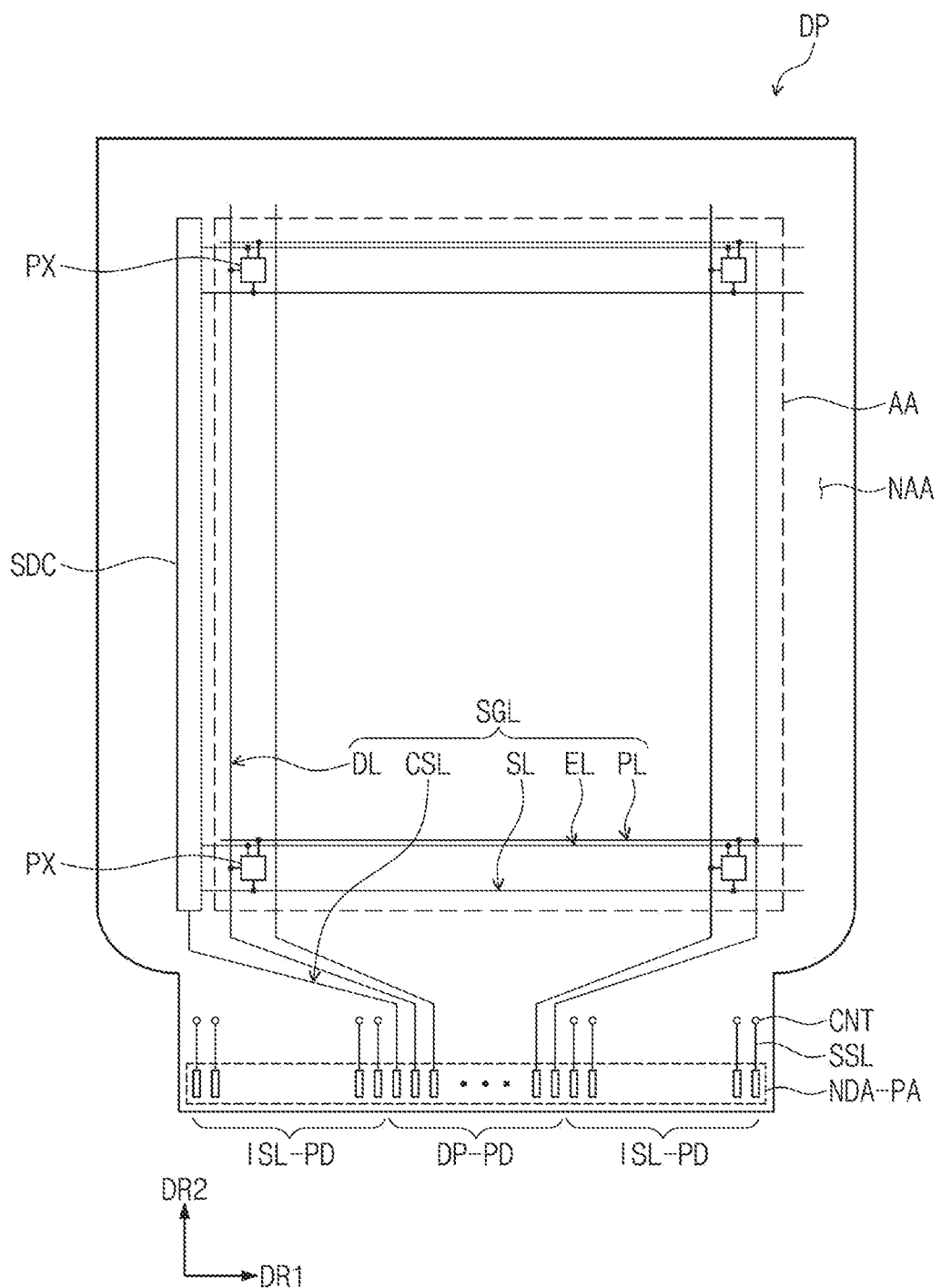
FIG. 4 is a plan view of a display panel according to an embodiment of the present disclosure.

FIG. 4 is a plan view of a display panel DP according to an embodiment of the present disclosure.

As shown in FIG. 4, the display panel DP may include a scan driving circuit SDC, a plurality of signal lines SGL (hereinafter referred to as signal lines), a plurality of signal pads DP-PD and ISL-PD (hereinafter referred to as signal pads), and a plurality of pixels PX (hereinafter referred to as pixels).

The scan driving circuit SDC generates a plurality of scan signals (hereinafter, referred to as scan signals), and sequentially outputs the scan signals to a plurality of scan lines SL (hereinafter referred to as scan lines) described in more detail later. The scan driving circuit SDC may output scan signals and other control signals to the pixels PX.

The scan driving circuit SDC may include a plurality of transistors formed through a same process as the transistors in the pixels PX.

The signal lines SGL include scan lines SL, data lines DL, a power line PL, emission control lines EL, and control signal lines CSL. Each of the scan lines SL, the data lines DL, and the emission control lines EL is connected to a corresponding pixel PX from among the pixels PX. The power line PL is commonly connected to the pixels PX. The control signal line CSL may provide control signals to the scan driving circuit SDC. The power line PL may be any one of first, second, and third voltage lines VL1, VL2, and VL3 (see FIG. 5) to be described in more detail later. For example, in some embodiments, the power line PL may include the first, second, and third voltage lines VL1, VL2, and VL3.

In the present embodiment, the signal lines SGL may further include auxiliary lines SSL. The auxiliary lines SSL are signal lines connected to the input detection layer ISL (see FIG. 2). In an embodiment of the present disclosure, the auxiliary lines SSL may be omitted. The auxiliary lines SSL are connected to the contact holes CNT, respectively. The auxiliary lines SSL may be connected to signal lines of an input detection layer ISL (see FIG. 6), which will be described in more detail later, through the contact holes CNT.

The signal pads DP-PD and ISL-PD may include first type (e.g., first kind of) signal pads DP-PD connected to the data lines DL, the power line PL, and the control signal line CSL and second type (e.g., second kind of) signal pads ISL-PD connected to the auxiliary lines SSL. The first type signal pads DP-PD and the second type signal pads ISL-PD are disposed adjacent to each other in the pad area NDA-PA defined in a part of the peripheral area NAA. A stacked structure or constituent material of the signal pads DP-PD and ISL-PD may not be distinguished from each other, and may be formed through the same process. For example, the first type signal pads DP-PD may include (e.g., consist of) the same material and/or have the same structure as the second type signal pads ISL-PD.

The active area AA may be defined as an area where the pixels PX are disposed. A plurality of electronic elements are disposed in the active area AA. The electronic devices include an organic light emitting diode provided in each of the pixels PX and a pixel driving circuit connected thereto. The scan driving circuit SDC, the signal lines SGL, the signal pads DP-PD and ISL-PD, and the pixel driving circuit may be included in the circuit element layer DP-CL shown in FIG. 3.

Figure 5:
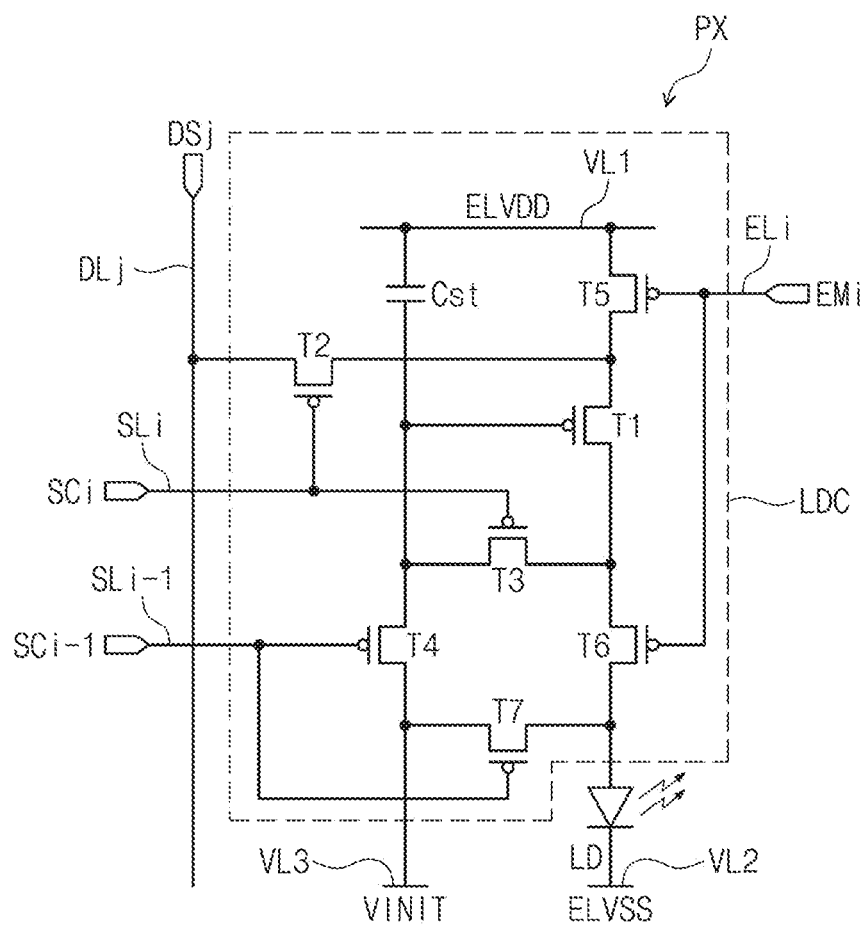
FIG. 5 is a view illustrating a circuit configuration of a pixel of a plurality of pixels shown in FIG. 4.

For example, as illustrated in FIG. 5, the pixel PX may include a plurality of transistors T1 to T7, a capacitor Cst, and an organic light emitting diode LD. A more detailed circuit configuration and operation of the pixel PX will be described later in more detail.

The signal pads DP-PD and ISL-PD of the display panel DP may be electrically connected to a printed circuit board.

A portion of the display panel DP shown in FIG. 4 may be bent or bendable. A portion of the peripheral area NAA of the display panel DP may be bent or bendable, and may be bent or bendable based on a bending axis parallel to the first direction DR1. The bending axis may be defined to overlap a part of the data lines DL and a part of the auxiliary lines SSL.

FIG. 5 is a view illustrating a circuit configuration of a pixel of the plurality of pixels PX shown in FIG. 4.

Each of the pixels PX illustrated in FIG. 4 may have the same circuit configuration as the pixel PX illustrated in FIG. 5. The light emitting pixel PX shown in FIG. 5 is connected to the j-th data line DLj from among the plurality of data lines DL, the (i−1)-th scan line SLi−1 and the i-th scan line SLi from among the plurality of scan lines SL, and the i-th emission control line ELi from among the plurality of emission control lines EL.

The pixel PX includes an organic light emitting diode LD and a pixel driving circuit LDC. In this embodiment, an example in which one pixel PX includes one organic light emitting diode LD is described.

In this embodiment, the pixel driving circuit LDC of the pixel PX includes seven transistors T1-T7 and one capacitor Cst. In addition, the first to seventh transistors T1 to T7 may be P-type (e.g., P-based) channel transistors such as PMOS transistors. However, the present disclosure is not limited to this, and at least one selected from among the first to seventh transistors T1 to T7 may be an N-type (e.g., N-based) transistor. In addition, the circuit configuration of the pixel driving circuit LDC is not limited to FIG. 5. The pixel driving circuit LDC shown in FIG. 5 is merely an example, and the configuration of the pixel driving circuit LDC may be suitably modified and implemented.

Referring to FIG. 5, the pixel driving circuit LDC of the pixel PX according to an embodiment includes first to seventh transistors T1, T2, T3, T4, T5, T6, and T7 and a capacitor Cst. The pixel driving circuit LDC is connected to the j-th data line DLj, the (i−1)-th scan line SLi−1, the i-th scan line SLi, the i-th emission control line ELi, and the first, second, and third voltage lines VL1, VL2, and VL3.

The (i−1)-th scan line SLi−1 may transmit a second scan signal SCi−1, and the i-th scan line SLi may transmit a first scan signal SCi. The first and second scan signals SCi and Sci−1 may transmit a gate on voltage and a gate off voltage for turning on/off the transistors T2, T3, T4, and T7 included in the pixel PX. In this embodiment, an example in which the (i−1)-th scan line SLi−1 transmits the gate-on voltage at a time earlier than the i-th scan line SLi (e.g., at a time earlier than when the i-th scan line SLi transmits the gate-on voltage) will be mainly described.

The i-th emission control line ELi may transmit an emission control signal EMi for controlling emission of the organic light emitting diode LD. The emission control signal EMi transmitted by the i-th emission control line ELi may have a waveform different from that of the first and second scan signals SCi and SCi−1 transmitted by the scan lines SLi and SLi−1. The data line DLj is to transmit the data signal DSj. The first voltage line VL1 is to transmit the first driving voltage ELVDD, the second voltage line VL2 is to transmit the second driving voltage ELVSS, and the third voltage line VL3 is to receive the initialization voltage VINIT. In some embodiments, the second voltage line VL2 may be a driving signal wire configured to supply a driving signal to the pixels.

The gate electrode of the first transistor T1 is connected to one end of the capacitor Cst. The source electrode of the first transistor T1 is connected to the first voltage line VL1 via (e.g., through) the fifth transistor T5. The drain electrode of the first transistor T1 is electrically connected to the anode electrode AE (see FIG. 13) of the light emitting diode LD via (e.g., through) the sixth transistor T6. The first transistor T1 may receive a data signal DSj transmitted by the data line DLj to supply a driving current to the organic light emitting diode LD according to the switching operation of the second transistor T2.

The gate electrode of the second transistor T2 is connected to the scan line SLi. The source electrode of the second transistor T2 is connected to the data line DLj. The drain electrode of the second transistor T2 is connected to the source electrode of the first transistor T1 and is connected to the first voltage line VL1 via (e.g., through) the fifth transistor T5. The second transistor T2 may be turned on according to the first scan signal SCi received through the scan line SLi and transmit (e.g., to transmit) the data signal DSj transmitted from the data line DLj to the source electrode of the first transistor T1.

The gate electrode of the third transistor T3 is connected to the scan line SLi. The drain electrode of the third transistor T3 is commonly connected to the drain electrode of the fourth transistor T4, the one end of the capacitor Cst, and the gate electrode of the first transistor T1. The source electrode of the third transistor T3 is connected to the drain electrode of the first transistor T1 and is connected to the anode electrode of the light emitting diode LD via (e.g., through) the sixth transistor T6.

The third transistor T3 may be turned on according to the first scan signal SCi received through the scan line SLi and connect (e.g., to connect) the gate electrode and the drain electrode of the first transistor T1 to diode-connect the first transistor T1.

The gate electrode of the fourth transistor T4 is connected to the scan line SLi−1. The source electrode of the fourth transistor T4 is connected to the third voltage line VL3. The drain electrode of the fourth transistor T4 is connected to the one end of the capacitor Cst and the gate electrode of the first transistor T1 (e.g., connected to the one end of the capacitor Cst and the gate electrode of the first transistor T1 through the drain electrode of the third transistor T3). The fourth transistor T4 is turned on according to the second scan signal SCi-1 received through the scan line SLi-1 and transmits (e.g., to transmit) the initialization voltage VINIT to the gate electrode of the first transistor T1, thereby performing an initialization operation to initialize the voltage of the gate electrode of the first transistor T1.

The gate electrode of the fifth transistor T5 is connected to the emission control line ELi. The source electrode of the fifth transistor T5 is connected to the first voltage line VL1. The drain electrode of the fifth transistor T5 is connected to the source electrode of the first transistor T1 and the drain electrode of the second transistor T2.

The gate electrode of the sixth transistor T6 is connected to the emission control line ELi. The source electrode of the sixth transistor T6 is connected to the drain electrode of the first transistor T1 and the source electrode of the third transistor T3. The drain electrode of the sixth transistor T6 is electrically connected to the anode electrode of the organic light emitting diode LD. The fifth transistor T5 and the sixth transistor T6 are simultaneously or concurrently turned on according to the emission control signal EMi transmitted through the emission control line ELi. As a result, the first driving voltage ELVDD may be compensated through the diode-connected first transistor T1 and transmitted to the light emitting diode LD. For example, the first driving voltage ELVDD may be transmitted through the diode-connected first transistor T1 to be transmitted to the light emitting diode LD.

The gate electrode of the seventh transistor T7 is connected to the scan line SLi−1. The source electrode of the seventh transistor T7 is connected to the drain electrode of the sixth transistor T6 and the anode of the light emitting diode LD. The drain electrode of the seventh transistor T7 is connected to the source electrode of the fourth transistor T4 and the third voltage line VL3.

As described above, the one end of the capacitor Cst is connected to the gate electrode of the first transistor T1, and another end thereof is connected to the first voltage line VL1. The cathode electrode E2 (see FIG. 9) of the light emitting diode LD may be connected to the second voltage line VL2, the second voltage line VL2 to transmit the second driving voltage ELVSS. The structure of the pixel PX according to the present disclosure is not limited to the structure shown in FIG. 5, and the number of transistors, the number of capacitors, and the connection relations in the pixel PX may be variously and suitably modified.

Figure 6:
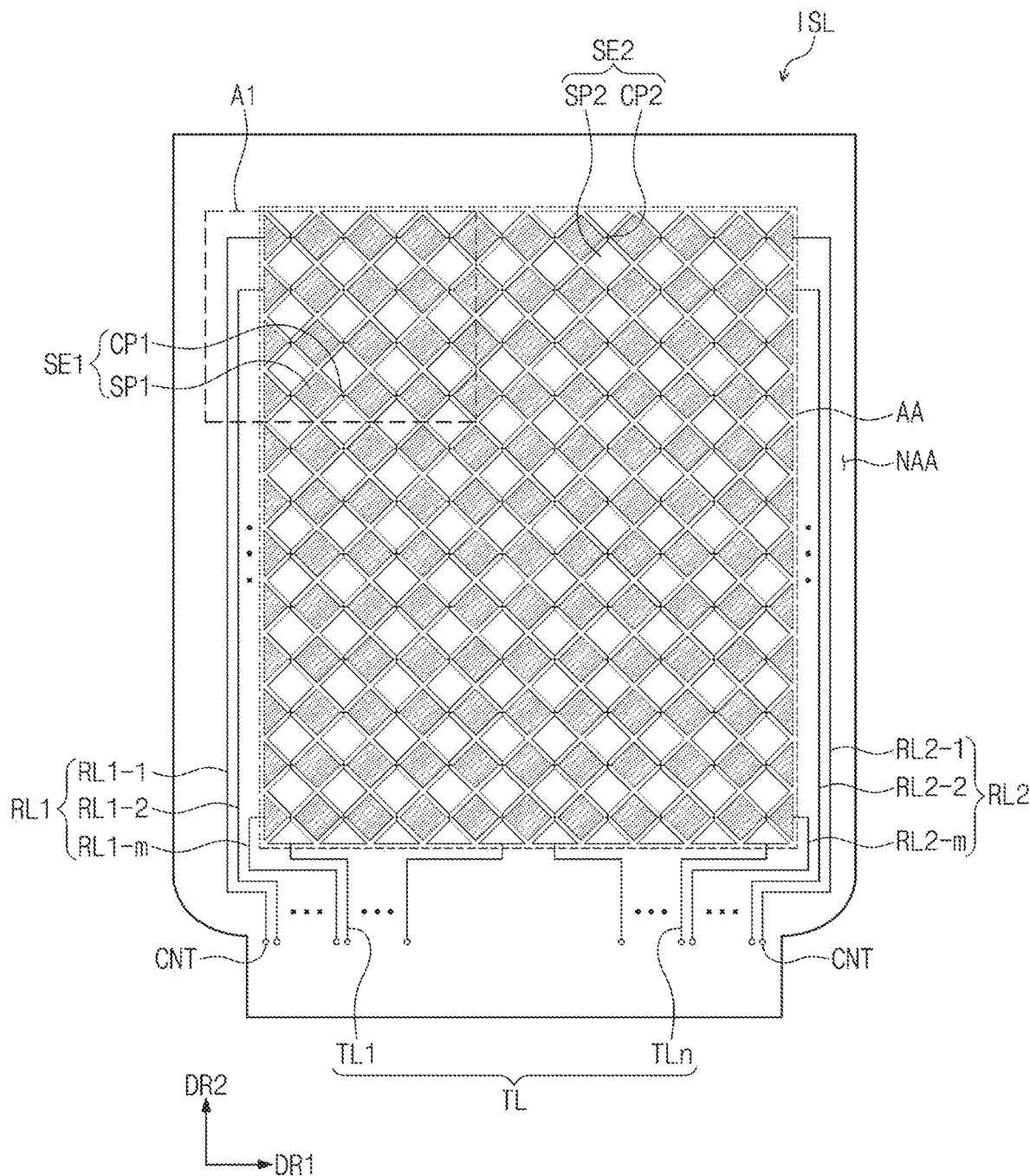
FIG. 6 is a plan view of an input detection layer according to an embodiment of the present disclosure.
Figure 7:
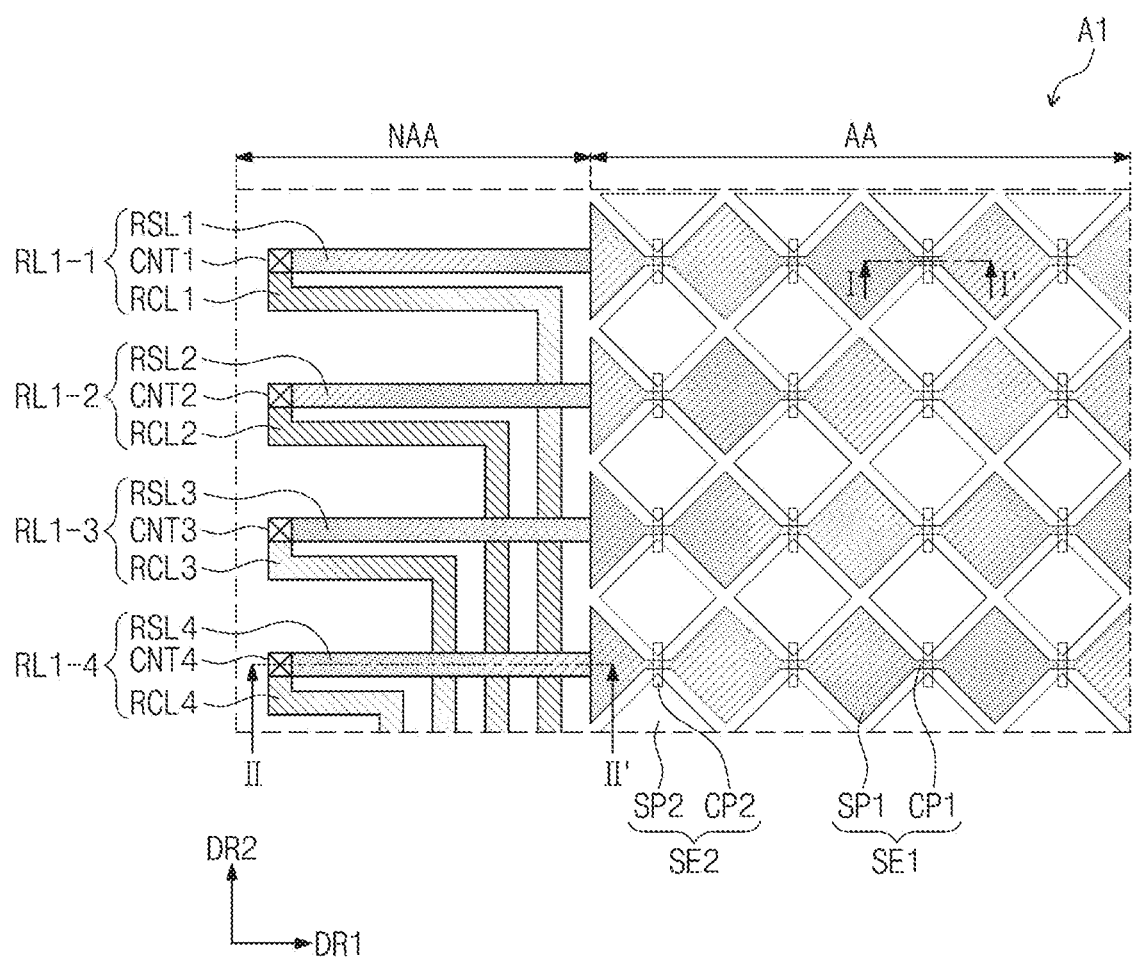
FIG. 7 is an enlarged plan view of a first area illustrated in FIG. 6.

FIG. 6 is a plan view of an input detection layer ISL according to an embodiment of the present disclosure. FIG. 7 is an enlarged plan view of the first area A1 illustrated in FIG. 6.

Referring to FIGS. 6 and 7, the input detection layer ISL includes a first detection electrode SE1, a second detection electrode SE2, and a signal wire part connected to the detection electrodes SE1 and SE2. In this embodiment, the signal wire part includes a first reception wire part RL1, a second reception wire part RL2, and a transmission wire part TL. The input detection layer ISL includes an active area AA and a peripheral area NAA corresponding to the image area DD-DA and the bezel area DD-NDA. The active area AA and the peripheral area NAA of the input detection layer ISL may substantially correspond to the active area AA and the peripheral area NAA of the display panel DP (see FIG. 4). The active area AA of the input detection layer ISL may be defined as an area where the first detection electrode SE1 and the second detection electrode SE2 are disposed. The first reception wire part RL1, the second reception wire part RL2, and the transmission wire part TL are disposed in the peripheral area NAA.

In this embodiment, the input detection layer ISL may be a capacitive touch sensor. One of the first detection electrode SE1 and the second detection electrode SE2 receives a driving signal, and the other outputs an amount of change in capacitance between the first detection electrode SE1 and the second detection electrode SE2 as a sensing signal.

The first detection electrode SE1 may include a plurality of first detection patterns SP1 and a plurality of first connection patterns CP1. The plurality of first detection patterns SP1 has a shape extending in the first direction DR1. At least one first connection pattern CP1 may be connected to two first detection patterns SP1 adjacent to each other. For example, the first detection patterns SP1 are arranged in the first and second directions DR1 and DR2, and the first connection patterns CP1 connect two first detection patterns SP1 adjacent to each other in the first direction DR1.

The second detection electrode SE2 may include a plurality of second detection patterns SP2 and a plurality of second connection patterns CP2. The plurality of second detection patterns SP2 has a shape extending in the second direction DR2. At least one second connection pattern CP2 may be connected to two second detection patterns SP2 adjacent to each other. For example, the second detection patterns SP2 are arranged in the first and second directions DR1 and DR2, and the second connection patterns CP2 connect two second detection patterns SP2 adjacent to each other in the second direction DR2.

The number and shape of the first detection patterns SP1 and the second detection patterns SP2 arranged (e.g., extending) in the respective first and second directions DR1 and DR2 are not limited to those shown in FIG. 6 and may be variously and suitably changed.

The first reception wire part RL1, the second reception wire part RL2, and the transmission wire part TL are disposed in the peripheral area NAA. The first reception wire part RL1 is connected to one end of the first detection electrode SE1. The second reception wire part RL2 is connected to another end of the first detection electrode SE1. The other end of the first detection electrode SE1 may be a portion facing away from the one end of the first detection electrode SE1. For example, the one end and the other end of the first detection electrode SE1 may be opposite ends of the first detection electrode SE1. The transmission wire part TL is connected to one end of the second detection electrode SE2.

According to the present disclosure, the second detection electrode SE2 arranged (e.g., extending) in the second direction DR2 may have a relatively longer length than the first detection electrode SE1 arranged in the first direction DR1. For example, the first detection electrode SE1 includes m first detection pattern groups arranged in the second direction DR2 and n first detection patterns SP1 are connected to each other in the first direction DR1 in each first detection pattern group. Meanwhile, the second detection electrode SE2 includes n second detection pattern groups arranged in the first direction DR1 and m second detection patterns SP2 are connected to each other in the second direction DR2 in each second detection pattern group. Here, n and m are natural numbers, and m may be a number greater than n. In this case, the length of each second detection pattern group may be longer than the length of the first detection pattern group. By connecting both ends (e.g., the one end and the other end) of the first detection electrode SE1 to the first and second reception wire parts RL1 and RL2, respectively, the sensitivity according to the position of the first detection electrode SE1 may be maintained uniformly.

The transmission wire part TL includes a plurality of transmission wires TL1 to TLn respectively connected to one sides of the n second detection pattern groups. The plurality of transmission wires TL1 to TLn are disposed in the peripheral area NAA. One ends of the plurality of transmission wires TL1 to TLn may be electrically connected to the auxiliary lines SSL illustrated in FIG. 4 through the contact holes CNT.

The first reception wire part RL1 includes a plurality of first reception wires RL1-1 to RL1-$m$ respectively connected to first sides (e.g., first ends) of them first detection pattern groups. The plurality of first reception wires RL1-1 to RL1-$m$ are disposed in the peripheral area NAA. One ends of the plurality of first reception wires RL1-1 to RL1-$m$ may be electrically connected to the auxiliary lines SSL illustrated in FIG. 4 through the contact holes CNT.

The second reception wire part RL2 includes a plurality of second reception wires RL2-1 to RL2-$m$ respectively connected to second sides (e.g., second ends) of the m first detection pattern groups. The plurality of second reception wires RL2-1 to RL2-$m$ are disposed in the peripheral area NAA. One ends of the plurality of second reception wires RL2-1 to RL2-$m$ may be electrically connected to the auxiliary lines SSL illustrated in FIG. 4 through the contact holes CNT.

Each of the first reception wires RL1-1 to RL1-$m$ includes a detection wire, a connection wire, and a contact part. For example, as shown in FIG. 7, the first reception wire RL1-1 includes a detection wire RSL1, a connection wire RCL1, and a contact part CNT1. The first reception wire RL1-2 includes a detection wire RSL2, a connection wire RCL2, and a contact part CNT2. The first reception wire RL1-3 includes a detection wire RSL3, a connection wire RCL3, and a contact part CNT3. The first reception wire RL1-4 includes a detection wire RSL4, a connection wire RCL4, and a contact part CNT4. Each of the second reception wires RL2-1 to RL2-$m$ may include a detection wire, a connection wire, and a contact part in the same manner as the first reception wires RL1-1 to RL1-$m$.

The detection wires RSL1-RSL4 extend from the first detection patterns SP1 and are disposed on the same layer as the first detection patterns SP1. In the peripheral area NAA, the connection wires RCL1-RCL4 may overlap the detection wires RSL1-RSL4. The connection wires RCL1-RCL4 may be formed in a different layer than the detection wires RSL1-RSL4. The contact parts CNT1-CNT4 connect the connection wires RCL1-RCL4 and the detection wires RSL1-RSL4 in the peripheral area NAA.

It is shown in, and described with respect to, FIGS. 6 and 7 that each of the first reception wires RL1-1 to RL1-$m$ and the second reception wires RL2-1 to RL2-$m$ includes a detection wire, a connection wire, and a contact part. However, the present disclosure is not limited thereto. The transmission wires TL1 to TLn may also include a detection wire, a connection wire, and a contact part. The input detection layer ISL may further include a plurality of transmission wires respectively connected to another sides (e.g., sides opposite to the one sides of then second detection pattern groups) of the n second detection pattern groups. In addition, the plurality of transmission wires each respectively connected to the other sides of the second detection pattern groups may also include a detection wire, a connection wire, and a contact part.

Figure 8:
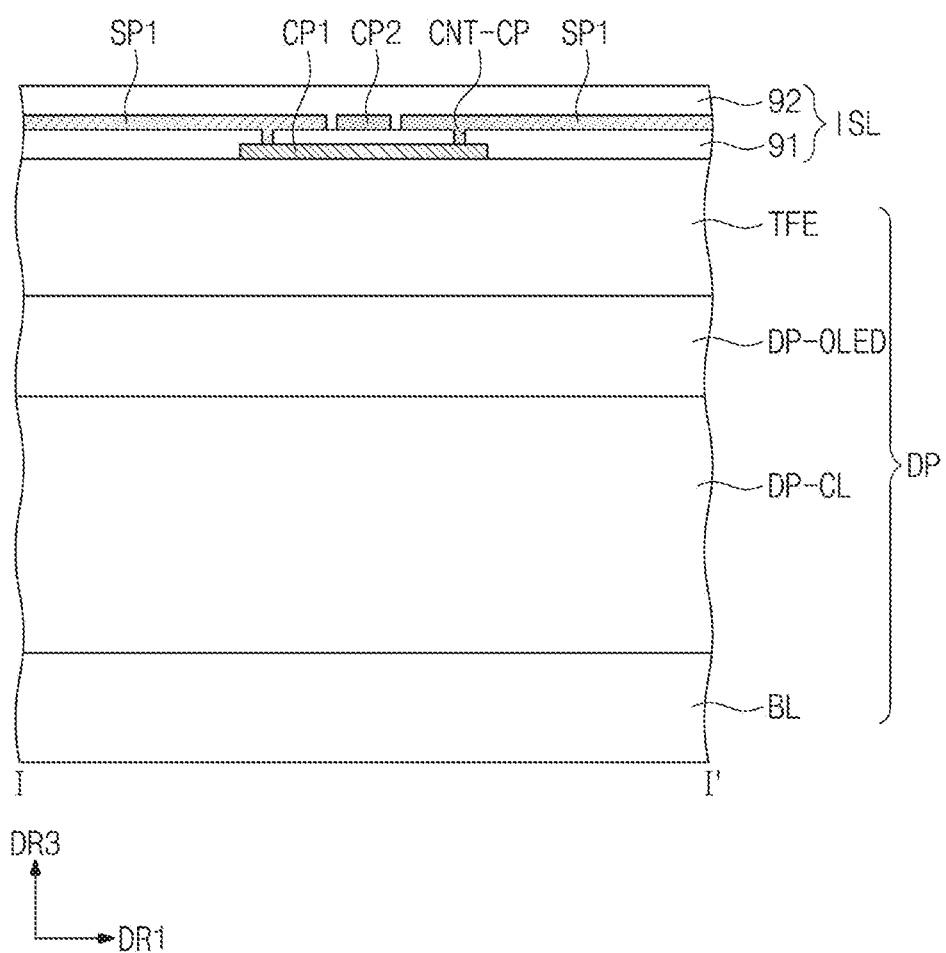
FIG. 8 is a cross-sectional view taken along line I-I' of FIG. 7.

FIG. 8 is a cross-sectional view taken along line I-I' of FIG. 7. FIG. 8 illustrates an embodiment in which the first connection pattern CP1 and the second connection pattern CP2 cross or intersect each other. In the present embodiment, the first connection pattern CP1 may correspond to a bridge pattern. In another embodiment of the present disclosure, the second connection pattern CP2 may be a bridge pattern.

Referring to FIGS. 7 and 8, an input detection layer ISL is disposed on the display panel DP. The input detection layer ISL may include a first conductive layer CP1, a first insulating layer 91 (hereinafter referred to as a first input insulating layer), second conductive layers SP1 and CP2, and a second insulating layer 92 (hereinafter referred to as second input insulating layer). The first input insulating layer 91 is disposed directly on the thin film encapsulation layer TFE.

Each of the first conductive layer CP1 and the second conductive layers SP1 and CP2 may include a single layer structure or a multilayer structure stacked along the third direction axis DR3. A conductive layer of the multilayer structure may include at least two of transparent conductive layers and metal layers. In some embodiments, the multiplayer structure may have at least two transparent conductive layers and at least two metal layers. In some embodiments, the multilayer structure may have at least one transparent conductive layer and at least one metal layer. A conductive layer of the multilayer structure may include metal layers with different metals. The transparent conductive layer may include (e.g., be) indium tin oxide (ITO), indium zinc oxide (IZO), zinc oxide (ZnO), indium tin zinc oxide (ITZO), PEDOT, metal nano wire, and/or graphene. The metal layer may include (e.g., be) silver, titanium, copper, aluminum, and/or an alloy thereof. For example, each of the first conductive layer CP1 and the second conductive layers SP1 and CP2 may have a three-layer metal layer structure, for example, a three-layer structure of titanium/aluminum/titanium. Metals with relatively high durability and low reflectance may be applied to the outer layer, and metals with high electrical conductivity may be applied to the inner layer.

Each of the first input insulating layer 91 and the second input insulating layer 92 may include an inorganic layer and/or an organic layer. In this embodiment, the first input insulating layer 91 and the second input insulating layer 92 may be inorganic layers. The inorganic layer may include (e.g., be) at least one selected from among aluminum oxide, titanium oxide, silicon oxide, silicon oxynitride, zirconium oxide, and hafnium oxide. In another embodiment, the second input insulating layer 92 may include an organic layer. The organic layer may include (e.g., be) at least one selected from among acrylic resin, methacrylic resin, polyisoprene, vinyl resin, epoxy resin, urethane resin, cellulose resin, siloxane-based resin, polyimide-based resin, polyamide-based resin, and perylene resin.

Each of the first conductive layer CP1 and the second conductive layers SP1 and CP2 includes a plurality of conductive patterns. In the example illustrated in FIG. 8, it is described that the first conductive layer CP1 includes the first connection pattern CP1, and the second conductive layers SP1 and CP2 include the first detection pattern SP1 and the second connection pattern CP2.

The first detection pattern SP1 and the first connection pattern CP1 may be connected to each other through the contact hole CNT-CP passing through the first input insulating layer 91. Although the first connection pattern CP1 and the second connection pattern CP2 are illustrated as crossing (overlapping) each other in the present embodiment, the present disclosure is not limited thereto. For example, the first connection pattern CP1 may be transformed into (e.g., may have a shape of) a bent line of "158"

and/or a bent line of "\/" so as not to overlap the second connection pattern CP2. The first connection pattern CP1 in the form of (e.g., having the shape of) a bent line of "/\" and/or a bent line of "\/" may overlap the second detection pattern SP2 on a plane.

Figure 9:
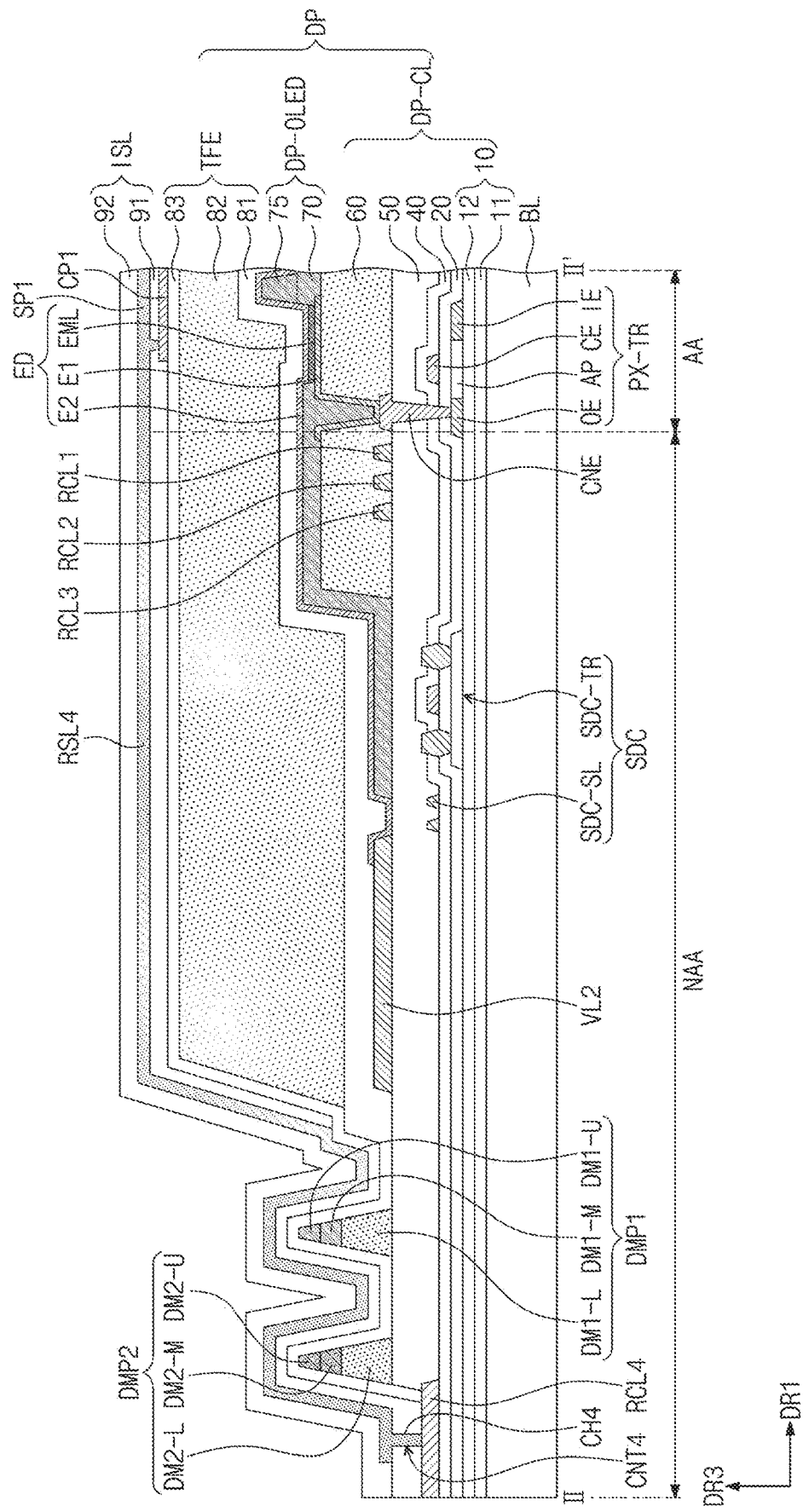
FIG. 9 is a cross-sectional view taken along line II-II' of FIG. 7 according to an embodiment of the present disclosure.

FIG. 9 is a cross-sectional view taken along line II-II' of FIG. 7 according to an embodiment of the present disclosure.

Referring to FIGS. 7 and 9, the display panel DP includes a base layer BL, a circuit element layer DP-CL, a light emitting element layer DP-OLED, and a thin film encapsulation layer TFE. In an embodiment, the base layer BL, the circuit element layer DP-CL, the light emitting element layer DP-OLED, and the thin film encapsulation layer TFE may be sequentially stacked in the third direction DR3.

The base layer BL may be a member that provides a base surface where the circuit element layer DP-CL is disposed. The base layer BL may be a glass substrate, a metal substrate, a plastic substrate, or the like. However, the present disclosure is not limited thereto, and the base layer BL may be an inorganic layer, an organic layer or a composite layer.

The circuit element layer DP-CL is disposed on the base layer BL. The circuit element layer DP-CL may include a pixel driving circuit LDC (see FIG. 5). For example, the circuit element layer DP-CL may include the transistors T1 to T7 (see FIG. 5), the capacitor Cst (see FIG. 5), and the like. In FIG. 9, only one transistor PX-TR (hereinafter referred to as a pixel transistor) is illustrated for convenience of description. Here, the pixel transistor PX-TR may be the sixth transistor T6 described with reference to FIG. 5.

The circuit element layer DP-CL further includes insulating layers 10, 20, 40, 50, and 60 stacked in the third direction DR3. The insulating layer 10 is disposed on the base layer BL. The insulating layer 10 may include a barrier layer 11 and a buffer layer 12.

The barrier layer 11 may include (e.g., be) an inorganic material. The barrier layer 11 can prevent or block oxygen and/or moisture flowing through the base layer BL from penetrating the pixels PX (see FIG. 5). The buffer layer 12 may include (e.g., be) an inorganic material. The buffer layer 12 can provide a lower surface energy to the pixels PX than the base layer BL so that the pixels PX are stably disposed on the base layer BL. In FIG. 4, each of the barrier layer 11 and the buffer layer 12 are shown as a single layer. However, this is illustratively shown, and the barrier layer 11 and the buffer layer 12 according to an embodiment of the present disclosure may be provided in plurality and may be stacked alternately each other. In some embodiments, at least one selected from among the barrier layer 11 and the buffer layer 12 may be provided in plurality or may be omitted.

The pixel transistor PX-TR may be disposed on the insulating layer 10. The pixel transistor PX-TR includes an active pattern AP, a control electrode CE, an input electrode IE, and an output electrode OE. The active pattern AP is disposed on the insulating layer 10. The semiconductor pattern AP, the control electrode CE and the input electrode IE may be formed from a semiconductor material. The control electrode CE is spaced apart from the active pattern AP with the insulating layer 20 therebetween. The control electrode CE may be connected to one electrode of the capacitor CP.

The input electrode IE and the output electrode OE are spaced apart with the active pattern AP therebetween.

The insulating layer 50 is disposed on the insulating layer 40 The insulating layer 40 may include (e.g., be) an organic material and/or an inorganic material, and may have a single layer or a laminated (e.g., multilayer) structure.

A connection electrode CNE may be disposed on the insulating layer 50. The connection electrode CNE penetrates the insulating layers 20, 40 and 50 and is connected to the output electrode OE. The insulating layer 60 may be disposed on the connection electrode CNE.

The pixel transistor PX-TR according to an embodiment of the present disclosure may be formed in (e.g., formed to have) various suitable structures, and is not limited to the embodiment shown in FIG. 9.

The light emitting element layer DP-OLED is disposed on the circuit element layer DP-CL. The light emitting element layer DP-OLED may include a plurality of light emitting elements ED.

The light emitting element ED is disposed on the insulating layer 60. The light emitting element ED may include a first electrode E1, a light emitting layer EML, and a second electrode E2. The first electrode E1 may penetrate the insulating layer 60 to be electrically connected to the pixel transistor PX-TR through the connection electrode CNE.

The insulating layer 70 may be disposed on the insulating layer 60. An opening part may be defined in the insulating layer 70, and the opening part may expose at least a portion of the first electrode E1. The insulating layer 70 may be a pixel defining layer.

The light emitting layer EML may be disposed on the first electrode E1 exposed by the opening part defined in the insulating layer 70. The light emitting layer EML may include (e.g., be) a light emitting material. For example, the light emitting layer EML may include (e.g., be composed of) at least one of materials emitting red, green, or blue light. The emission layer EML may include (e.g., be) a fluorescent material and/or a phosphorescent material. The light emitting layer EML may include (e.g., be) an organic light emitting material and/or an inorganic light emitting material. The light emitting layer EML may emit light in response to a potential difference between the first electrode E1 and the second electrode E2.

The second electrode E2 may be disposed on the light emitting layer EML. The second electrode E2 may be provided commonly to a plurality of pixels PX. The second electrode E2 may have a shape corresponding to the active area AA (see FIG. 4). The second electrode E2 may be electrically connected to the second voltage line VL2 (see FIG. 5). The second voltage line VL2 may provide the second driving voltage ELVSS (see FIG. 5) to the second electrode E2. Therefore, each light emitting element ED disposed in each of the pixels PX may receive a common second driving voltage ELVSS through the second electrode E2.

The second electrode E2 may include (e.g., be) a transmissive conductive material and/or a semi-transparent conductive material. Accordingly, light generated in the light emitting layer EML can be easily emitted toward the third direction DR3 through the second electrode E2. But, this is illustrated by way of example. Depending on the design, the light emitting element ED according to an embodiment of the present disclosure may be driven in a rear surface light-emission system in which the first electrode E1 includes (e.g., is) a transparent and/or semi-transparent material, or the light emitting element ED may be driven in a double-sided light-emission system in which light is emitted towards both front and rear surfaces, but the present disclosure is not limited to any one embodiment.

The thin film encapsulation layer TFE may be disposed on the light emitting element layer DP-OLED to seal the light emitting element ED. The thin film encapsulation layer TFE can cover the entire active area AA. The thin film encapsulation layer TFE may cover a portion of the peripheral area NAA. In another embodiment, the thin film encapsulation layer TFE may cover only the active area AA.

The thin film encapsulation layer TFE may include a first inorganic layer 81, an organic layer 82, and a second inorganic layer 83 sequentially stacked along the third direction DR3. In this embodiment, each of the first inorganic layer 81, the organic layer 82, and the second inorganic layer 83 is shown as a single layer. However, this is illustratively shown, and at least one selected from among the first inorganic layer 81, the organic layer 82, and the second inorganic layer 83 may be provided in plurality (e.g., may have a multilayer structure) or may be omitted, but the present disclosure is not limited to any one embodiment.

The first inorganic layer 81 may cover the second electrode E2. The first inorganic layer 81 can prevent or block external moisture and/or oxygen from penetrating the light emitting element ED. For example, the first inorganic layer 81 may include (e.g., be) silicon nitride, silicon oxide, or a combination thereof. The first inorganic layer 81 may be formed through a deposition process.

The organic layer 82 can (e.g., may) be disposed on the first inorganic layer 81 and may contact the first inorganic layer 81. The organic layer 82 can provide a flat surface on the first inorganic layer 81. For example, the organic layer 82 can provide a flat surface to the active area AA.

The curve formed on the upper surface of the first inorganic layer 81 and the particles existing on the first inorganic layer 81 are covered by the organic layer 82, such that this can prevent the influence of the surface state of the upper surface of the first inorganic layer 81 on the structures formed on the organic layer 82. Further, the organic layer 82 can relieve the stress between the contacting layers. The organic layer 82 may include (e.g., be) an organic material, and may be formed through a solution process such as a spin coating process, a slit coating process, or an ink jet process.

The second inorganic layer 83 is disposed on the organic layer 82 to cover the organic layer 82. The second inorganic layer 83 can be stably formed on a relatively flat surface as compared to being disposed on the first inorganic layer 81. The second inorganic layer 83 seals moisture and/or the like emitted from the organic layer 82 to prevent or block it from being introduced into the outside. The second inorganic layer 83 may include (e.g., be) silicon nitride, silicon oxide, or a combination thereof. The second inorganic layer 83 may be formed through a deposition process.

The circuit element layer DP-CL may include a scan driving circuit SDC (see FIG. 4) for driving the pixel driving circuit LDC (see FIG. 5). The scan driving circuit SDC is disposed in the peripheral area NAA. The scan driving circuit SDC includes at least one transistor SDC-TR formed through the same process as the pixel transistor PX-TR formed in the active area AA. The scan driving circuit SDC may include control signal lines SDC-SL disposed on the same layer as the input electrode IE of the pixel transistor PX-TR. The scan driving circuit SDC may further include control signal lines disposed on the same layer as the control electrode CE of the pixel transistor PX-TR.

The second voltage line VL2 may be provided in the peripheral area NAA and may be disposed outside the scan driving circuit SDC. The second voltage line VL2 may be disposed on the same layer as the connection electrode CNE of the pixel transistor PX-TR. The second voltage line VL2 may receive the second driving voltage ELVSS from the outside.

Referring to FIGS. 7 and 9, the connection wires RCL1-RCL4 are disposed in the peripheral area NAA. The connection wires RCL1-RCL4 overlap the detection wire RSL4 on a plane. The connection wires RCL1-RCL4 may be disposed on the same layer as the connection electrode CNE of the pixel transistor PX-TR. The connection wires RCL1-RCL4 may be disposed on the same layer as the second voltage line VL2 and may be electrically separated from the second voltage line VL2. In some embodiments, the connection wires RCL1-RCL4 may be spaced apart (e.g., electrically separated) from each other. In the example shown in FIG. 9, although the connection wires RCL1-RCL4 are illustrated and described as being disposed on the same layer as the second voltage line VL2, the present disclosure is not limited to this. The connection wires RCL1-RCL4 may be disposed on the same layer as other conductive layers in the circuit element layer DP-CL of the peripheral area NAA.

As described with reference to FIG. 8, the input detection layer ISL includes a first conductive layer, a second conductive layer, a first input insulating layer 91, and a second input insulating layer 92. The first conductive layer may be formed on the thin film encapsulation layer TFE. The first conductive layer may include at least one selected from among the first and second detection patterns SP1 and SP2 and the first and second connection patterns CP1 and CP2. As an example of the present disclosure, the first conductive layer may include the first connection pattern CP1. The first conductive layer is covered by the first input insulating layer 91.

The second conductive layer is disposed on the first input insulating layer 91. The second conductive layer may include at least one selected from among the first and second detection patterns SP1 and SP2 and the first and second connection patterns CP1 and CP2. The second conductive layer may include the second connection pattern CP2 and the first detection pattern SP1. In some embodiments, the detection wires RSL1-RSL4 may be on, on the same layer as, or connected to, the second conductive layer. For example, the detection wires RSL1-RSL4 may be connected to the first detection patterns SP1.

The second conductive layer is covered by the second input insulating layer 92. The first and second input insulating layers 91 and 92 may have an insulating property and may be optically transparent. The first and second input insulating layers 91 and 92 may include at least one selected from among an inorganic layer and an organic layer. The first and second input insulating layers 91 and 92 according to an embodiment of the present disclosure may include (e.g., be) various suitable materials and are not limited to any one embodiment.

The display panel DP may further include a first dam part DMP1 and a second dam part DMP2 disposed in the peripheral area NAA. Each of the first dam part DMP1 and the second dam part DMP2 may have a multilayer structure. The second dam part DMP2 may be disposed farther outside than the first dam part DMP1. For example, the second dam part DMP2 may be farther away from the active area AA (e.g., closer to the outer edge of the display panel DP) than the first dam part DMP1. The first dam part DMP1 includes a first lower dam DM1-L, a first intermediate dam DM1-M, and a first upper dam DM1-U. The second dam part DMP2 includes a second lower dam DM2-L, a second intermediate dam DM2-M, and a second upper dam DM2-U.

The first and second lower dams DM1-L and DM2-L may be formed simultaneously or concurrently with the sixth insulating layer 60. The first and second intermediate dams DM1-M and DM2-M are provided on the first and second lower dams DM1-L and DM2-L, respectively. The first and second intermediate dams DM1-M and DM2-M may be formed simultaneously or concurrently with the seventh insulating layer 70. The first and second upper dams DM1-U and DM2-U are provided on the first and second intermediate dams DM1-M and DM2-M, respectively. A dummy insulating layer 75 may be formed simultaneously or concurrently with the first and second upper dams DM1-U and DM2-U, and the dummy insulating layer 75 may be provided on the seventh insulating layer 70 in the active area AA.

The first dam part DMP1 and the second dam part DMP2 may be provided with a closed loop shape in the peripheral area NAA to surround the active area AA. Accordingly, the first dam part DMP1 and the second dam parts DMP2 prevent or block the liquid organic material (e.g., organic monomers) from spreading outward in the process of forming the organic layer 82 of the thin film encapsulation layer TFE. The organic layer 82 is formed by coating a liquid organic material on the first inorganic layer 81 through an inkjet method, and at this time, the first dam part DMP1 and the second dam part DMP2 may set a boundary of an area where a liquid organic material is disposed.

As an example of the present disclosure, a structure in which the display panel DP includes the first dam part DMP1 and the second dam part DMP2 is disclosed, but the present disclosure is not limited thereto. For example, the display panel DP may include only one dam part among the first dam part DMP1 and the second dam part DMP2. In some embodiments, the display panel DP may include three or more dam parts.

Also, although it is shown that each of the first dam part DMP1 and the second dam part DMP2 has a triple film (e.g., triple layer) structure, each of the first dam part DMP1 and the second dam part DMP2 may have a double film (e.g., double layer) structure. However, the present disclosure is not limited thereto, and each of the first dam part DMP1 and the second dam part DMP2 may have a structure including one film or four or more films.

The first inorganic layer 81 and the second inorganic layer 83 may contact each other at the upper part of the first dam part DMP1 and the second dam part DMP2. Because the organic layer 82 is disposed inside the area defined by the first dam part DMP1 and the second dam part DMP2, the first inorganic layer 81 and the second inorganic layer 83 may contact each other on the first dam part DMP1 and the second dam part DMP2 to seal the organic layer 82.

The contact part CNT4 is disposed outside the first dam part DMP1 and the second dam part DMP2, so that a contact structure for contact between the detection wire RSL4 and the connection wire RCL4 may be easily formed. In some embodiments, the contact part CNT4 is spaced apart from the organic layer 82 of the thin film encapsulation layer TFE on a plane. The contact part CNT4 may include a contact hole CH4, and the detection wire RSL4 may be connected to the connection wire RCL4 through the contact hole CH4. In some embodiments, the contact part CNT4 may be in, or may include at least a portion in, the contact hole CH4. In some embodiments, a portion of the detection wire RSL4 may overlap a portion of the connection wire RCL4 with the contact part CNT4 therebetween. The connection wire RCL4 connected to the contact part CNT4 may be disposed on the same layer as the input electrode IE and the output electrode OE of the pixel transistor PX-TR. Although a portion of the connection wire RCL4 connected to the contact part CNT4 is illustrated as being disposed on the insulating layer 40 in the example shown in FIG. 9, the connection wire RCL4 may be disposed between the insulating layer 20 and the insulating layer 40. In addition, in the example shown in FIG. 9, it is shown and described that a part of the connection wire RCL4 connected to the contact part CNT4 is disposed on the same layer as the input electrode IE and the output electrode OE of the pixel transistor PX-TR, but the present disclosure is not limited thereto. For example, a portion of the connection wire RCL4 connected to the contact part CNT4 may be disposed on the same layer as any one of the other conductive layers of the circuit element layer DP-CL.

In the example shown in FIG. 9, a portion of the connection wire RCL4 is connected with the contact part CNT4 at the same layer as the input electrode IE and the output electrode OE. In addition, a portion of the connection wire RCL4 may be disposed in parallel (e.g., substantially parallel) with the connection wires RCL1-RCL3 on the same layer as the connection wires RCL1-RCL3.

As described above, the organic layer 82 can provide a flat surface on the first inorganic layer 81. However, when formed (e.g., when the organic layer 82 is formed) through a solution process such as spin coating, slit coating, or an inkjet process, the upper surface of the organic layer 82 may have an inclined surface in the direction of the peripheral area NAA from the active area AA. When arranging the first reception wires RL1-1 to RL1-$m$ and the second reception wires RL2-1 to RL2-$m$ shown in FIG. 6 on the non-flat surface of the peripheral area NAA, defects due to short circuits between the wires or deviations in reception sensitivity due to height and/or width imbalances between the wires may occur.

In an embodiment of the present disclosure, the upper surface of the organic layer 82 overlapping the connection wires RCL1-RCL4 may not be flat. In addition, the connection wires RCL1-RCL4 may be disposed in the circuit element layer DP-CL of the peripheral area NAA to minimize or reduce the width of the peripheral area NAA. Therefore, the width in the first direction DR1 of the bezel area DD-NDA of the display device DD shown in FIG. 1 may be minimized or reduced.

Figure 10:
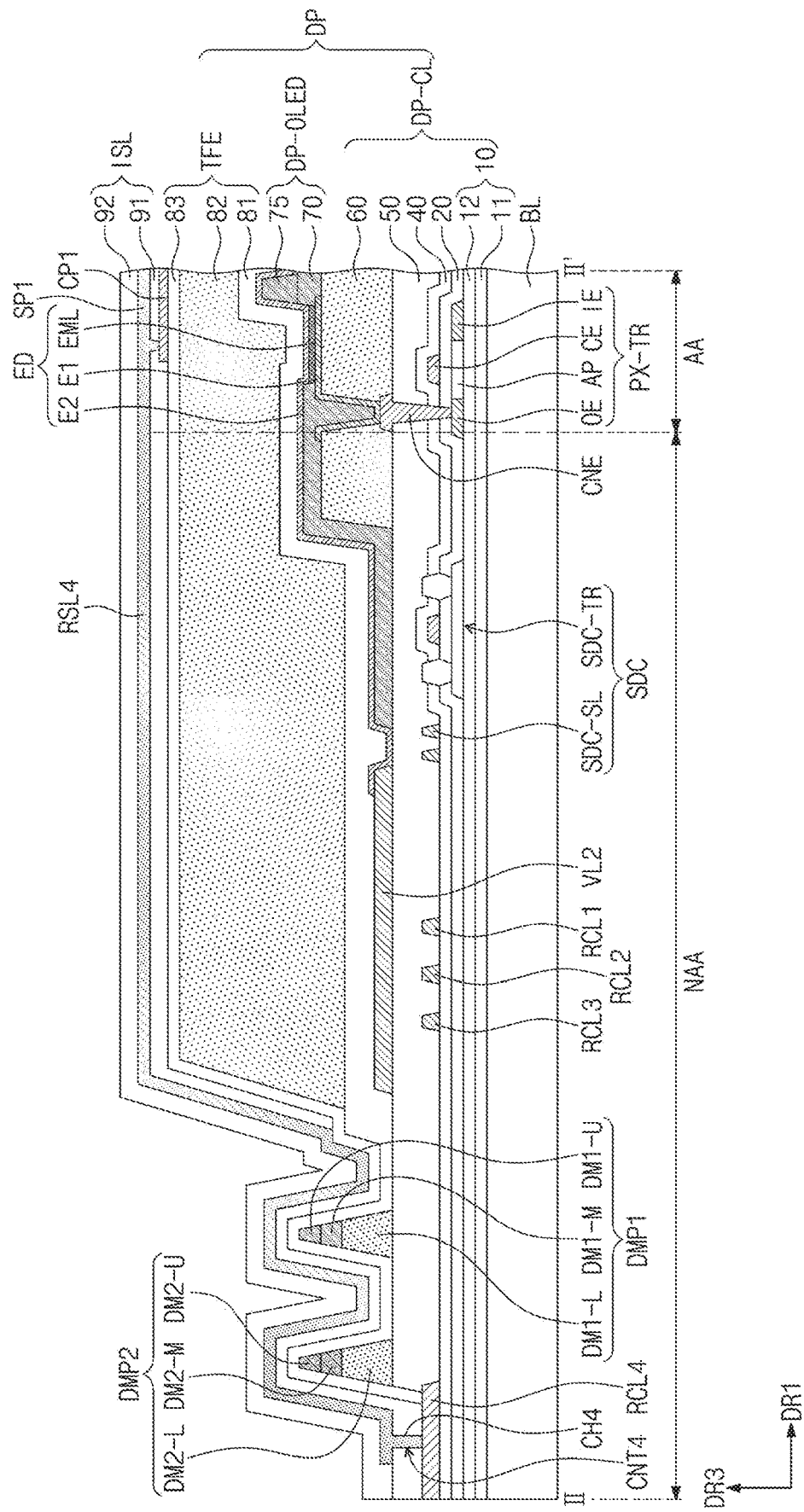
FIG. 10 shows another embodiment of a cross section corresponding to the line II-II' of FIG. 7.

FIG. 10 shows another embodiment of a cross section corresponding to the line II-II' of FIG. 7.

Referring to FIGS. 7 and 10, the connection wires RCL1-RCL4 are disposed in the peripheral area NAA. The connection wires RCL1-RCL4 may be disposed on the same layer as the input electrode IE and the output electrode OE of the pixel transistor PX-TR. On a plane, the connection wires RCL1-RCL3 may overlap the second voltage line VL2.

In the example shown in FIG. 10, a portion of the connection wire RCL4 is connected with the contact part CNT4 at the same layer as the input electrode IE and the output electrode OE. In addition, a portion of the connection wire RCL4 may be disposed in parallel (e.g., substantially parallel) with the connection wires RCL1-RCL3 on the same layer as the connection wires RCL1-RCL3.

Figure 11:
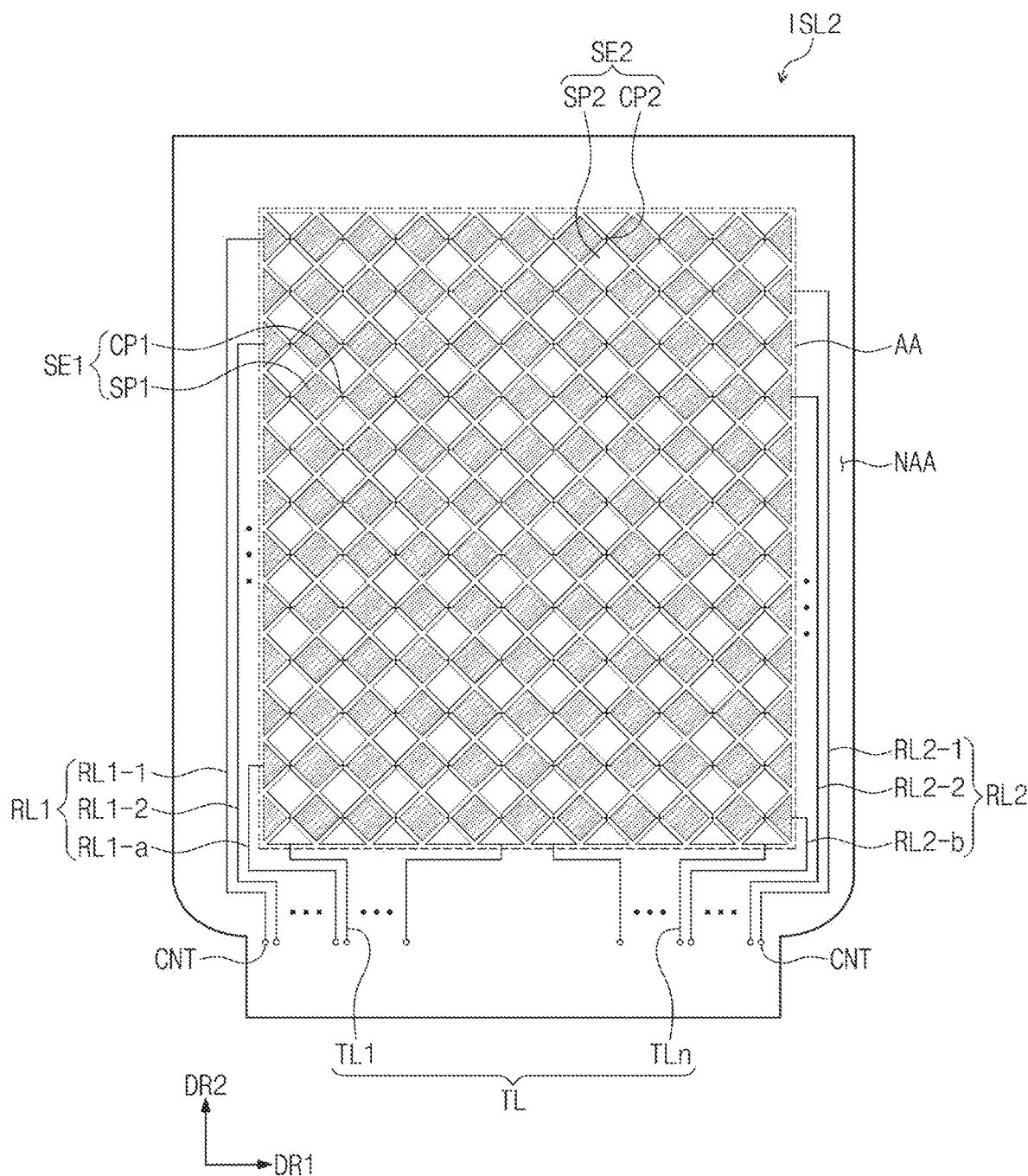
FIG. 11 is a plan view of an input detection layer according to an embodiment of the present disclosure.

FIG. 11 is a plan view of an input detection layer ISL2 according to an embodiment of the present disclosure.

Referring to FIG. 11, the input detection layer ISL2 includes a first detection electrode SE1, a second detection electrode SE2, and a signal wire part connected to the detection electrodes SE1 and SE2. In this embodiment, the signal wire part includes a first reception wire part RL1, a second reception wire part RL2, and a transmission wire part TL.

The first reception wire part RL1 includes a plurality of first reception wires RL1-1-RL1-$a$ connected the first sides of the first detection electrode SE1 in the odd-numbered first detection pattern groups among the m first detection pattern groups arranged in the second direction DR2. The plurality of first reception wires RL1-1-RL1-a are disposed in the peripheral area NAA. One ends of the plurality of first reception wires RL1-1-RL1-a may be electrically connected to the auxiliary lines SSL illustrated in FIG. 4 through the contact holes CNT.

The second reception wire part RL2 includes a plurality of second reception wires RL2-1 to RL2-b connected to the second sides of the first detection electrode SE1 in the even-numbered first detection pattern groups among the m first detection pattern groups arranged in the second direction DR2. The plurality of second reception wires RL2-1 to RL2-b are disposed in the peripheral area NAA. One ends of the plurality of second reception wires RL2-1 to RL2-b may be electrically connected to the auxiliary lines SSL illustrated in FIG. 4 through the contact holes CNT.

The transmission wire part TL includes a plurality of transmission wires TL1 to TLn respectively connected to the one sides of the n second detection pattern groups. The plurality of transmission wires TL1 to TLn are disposed in the peripheral area NAA. One ends of the plurality of transmission wires TL1 to TLn may be electrically connected to the auxiliary lines SSL illustrated in FIG. 4 through the contact holes CNT. Here, a, b, m, and n are natural numbers and m is equal to a+b (the sum of a and b).

Figure 12:
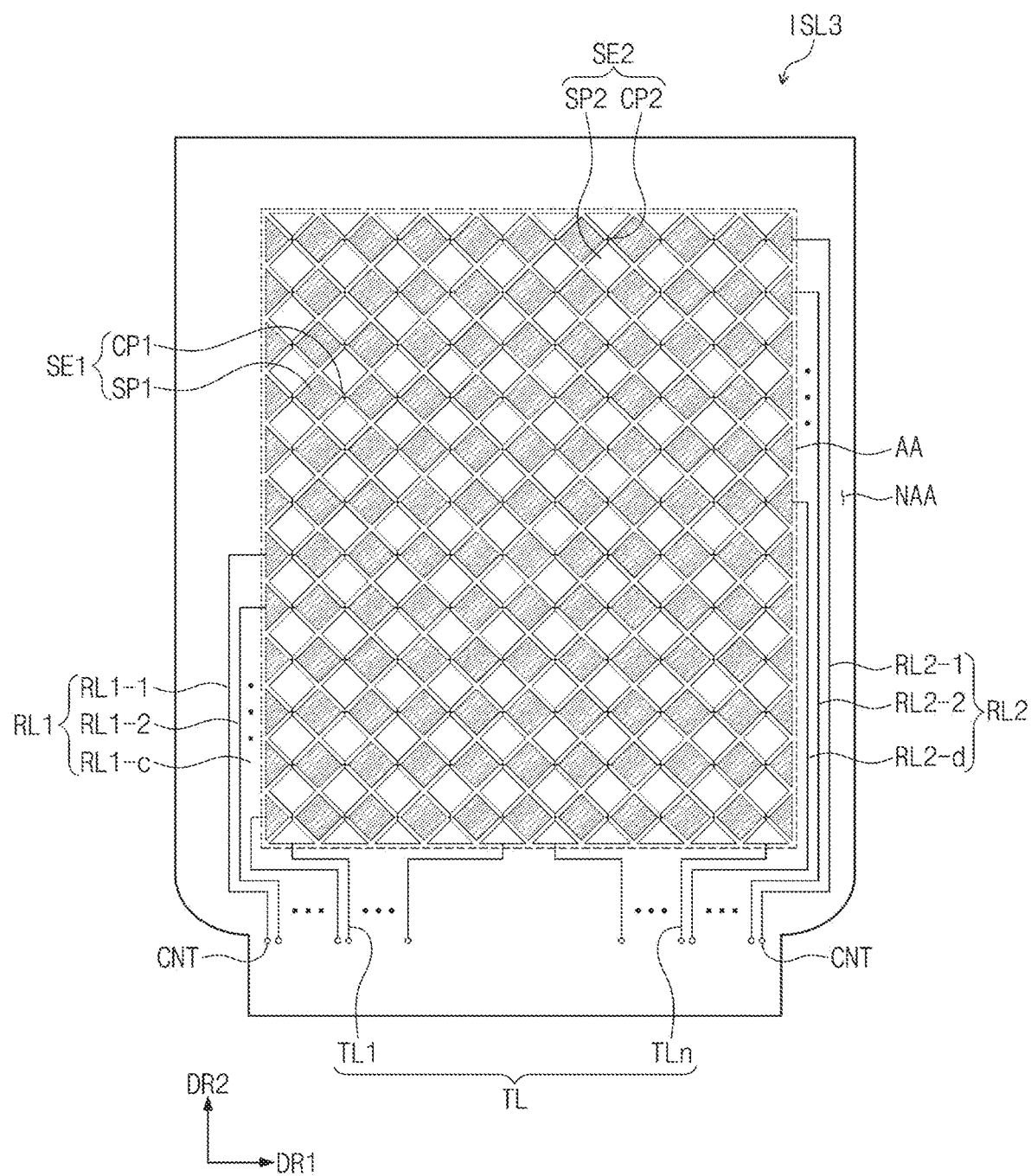
FIG. 12 is a plan view of an input detection layer according to an embodiment of the present disclosure.

FIG. 12 is a plan view of an input detection layer ISL3 according to an embodiment of the present disclosure.

Referring to FIG. 12, the input detection layer ISL3 includes a first detection electrode SE1, a second detection electrode SE2, and a signal wire part connected to the detection electrodes SE1 and SE2. In this embodiment, the signal wire part includes a first reception wire part RL1, a second reception wire part RL2, and a transmission wire part TL.

The first reception wire part RL1 includes a plurality of first reception wires RL1-1 to RL1-c connected the first sides of the first detection electrode SE1 in the lower first detection pattern groups among the m first detection pattern groups arranged in the second direction DR2. The plurality of first reception wires RL1-1 to RL1-c are disposed in the peripheral area NAA. One ends of the plurality of first reception wires RL1-1 to RL1-c may be electrically connected to the auxiliary lines SSL illustrated in FIG. 4 through the contact holes CNT.

The second reception wire part RL2 includes a plurality of second reception wires RL2-1 to RL2-d connected to the second sides of the first detection electrode SE1 in the upper first detection pattern groups among the m first detection pattern groups arranged in the second direction DR2. The plurality of second reception wires RL2-1 to RL2-d are disposed in the peripheral area NAA. One ends of the plurality of second reception wires RL2-1 to RL2-d may be electrically connected to the auxiliary lines SSL illustrated in FIG. 4 through the contact holes CNT.

The transmission wire part TL includes a plurality of transmission wires TL1 to TLn respectively connected to one sides of the n second detection pattern groups. The plurality of transmission wires TL1 to TLn are disposed in the peripheral area NAA. One ends of the plurality of transmission wires TL1 to TLn may be electrically connected to the auxiliary lines SSL illustrated in FIG. 4 through the contact holes CNT. Here, c, d, m, and n are natural numbers and m is equal to c+d (the sum of c and d).

The display device having such a configuration may utilize a portion of the signal wires of the display panel as the signal wire of the input detection layer. Therefore, the bezel area of the display device can be minimized or reduced.

Although the example embodiments of the present disclosure have been described, it is understood that the present disclosure should not be limited to these example embodiments and that various suitable changes and modifications can be made by one ordinary skill in the art within the spirit and scope of the present disclosure as defined by the claims and equivalents thereof.

What is claimed is:

1. A display device comprising:
    a base layer including an active area and a peripheral area outside the active area;
    a circuit element layer including a pixel in the active area of the base layer;
    a light emitting element layer including light emitting elements on the circuit element layer;
    a thin film encapsulation layer covering the light emitting element layer and including an organic layer; and
    an input detection layer on the thin film encapsulation layer and including a detection electrode and a detection wire electrically connected to the detection electrode,
    wherein the circuit element layer comprises:
    a connection wire overlapping the detection wire in the peripheral area; and
    a contact part electrically connecting the detection wire and the connection wire in the peripheral area,
    wherein the contact part is spaced apart from the organic layer of the thin film encapsulation layer on a plane.

2. The display device of claim 1, wherein the thin film encapsulation layer further comprises:
    a first inorganic layer between the light emitting element layer and the organic layer; and
    a second inorganic layer covering the organic layer.

3. The display device of claim 2,
    wherein at least a portion of the contact part is in a contact hole defined through the second inorganic layer,
    wherein the detection wire is electrically connected to the connection wire through the contact hole.

4. The display device of claim 3, further comprising a dam part on the circuit element layer and surrounding the active area,
    wherein the second inorganic layer covers the dam part.

5. The display device of claim 4, wherein the contact part is outside the dam part.

6. The display device of claim 1, wherein the detection electrode comprises:
    a first detection electrode; and
    a second detection electrode electrically insulated from the first detection electrode to form a capacitance.

7. The display device of claim 6, wherein the detection wire is electrically connected to the first detection electrode.

8. The display device of claim 6,
    wherein the first detection electrode comprises first detection patterns and a first connection pattern electrically connecting the first detection patterns, and
    wherein the second detection electrode comprises second detection patterns and a second connection pattern electrically connecting the second detection patterns.

9. The display device of claim 6, wherein the input detection layer comprises:
    a first conductive layer on the thin film encapsulation layer;
    a first input insulating layer on the first conductive layer; and a second conductive layer on the first input insulating layer, wherein the detection wire is on the second conductive layer, and the first conductive layer and the second conductive layer are in contact with each other.

10. The display device of claim 1, wherein the circuit element layer further comprises a driving signal wire in the peripheral area of the base layer to supply a driving signal to the pixel, and wherein the circuit element layer comprises a plurality of connection wires and the plurality of connection wires are spaced apart from each other on the same layer as the driving signal wire.

11. The display device of claim 1, wherein the circuit element layer further comprises a driving signal wire in the peripheral area of the base layer to supply a driving signal to the pixel, and wherein the connection wire overlaps the driving signal wire in a different layer on a plane.

12. A display device comprising:

a base layer including an active area and a peripheral area outside the active area;

a circuit element layer including a pixel in the active area of the base layer;

a light emitting element layer including light emitting elements on the circuit element layer;

a thin film encapsulation layer covering the light emitting element layer and including an organic layer; and an input detection layer on the thin film encapsulation layer, and including a detection electrode and a detection wire electrically connected to the detection electrode, wherein the circuit element layer comprises:

a driving signal wire in the peripheral area of the base layer to supply a driving signal to the pixel;

a connection wire overlapping the driving signal wire in the peripheral area; and a contact part connecting the detection wire and the connection wire in the peripheral area, and wherein the contact part is spaced apart from the organic layer of the thin film encapsulation layer on a plane.

13. The display device of claim 12, wherein the thin film encapsulation layer comprises:

a first inorganic layer between the light emitting element layer and the organic layer; and a second inorganic layer covering the organic layer.

14. The display device of claim 13, wherein at least a portion of the contact part is in a contact hole defined through the second inorganic layer, and wherein the detection wire is electrically connected to the connection wire through the contact hole.

15. The display device of claim 14, further comprising a dam part on the circuit element layer and surrounding the active area, wherein the second inorganic layer covers the dam part.

16. The display device of claim 15, wherein the contact part is outside the dam part.

17. The display device of claim 12, wherein the detection electrode comprises:

a first detection electrode; and a second detection electrode electrically insulated from the first detection electrode to form a capacitance.

18. The display device of claim 17, wherein the detection wire is electrically connected to the first detection electrode.

19. The display device of claim 18, wherein the first detection electrode comprises first detection patterns and a first connection pattern electrically connecting the first detection patterns, and wherein the second detection electrode comprises second detection patterns and a second connection pattern electrically connecting the second detection patterns.

20. The display device of claim 18, wherein the input detection layer comprises:

a first conductive layer on the thin film encapsulation layer;

a first input insulating layer on the first conductive layer; and a second conductive layer on the first input insulating layer, wherein the detection wire is on the second conductive layer, and the first conductive layer and the second conductive layer are in contact with each other.

* * * * *